US012538549B2

(12) United States Patent
Yamamoto

(10) Patent No.: US 12,538,549 B2
(45) Date of Patent: Jan. 27, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventor: Yoshiki Yamamoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 389 days.

(21) Appl. No.: 18/186,481

(22) Filed: Mar. 20, 2023

(65) Prior Publication Data

US 2023/0369457 A1 Nov. 16, 2023

(30) Foreign Application Priority Data

May 11, 2022 (JP) ................................. 2022-078211

(51) Int. Cl.
*H10D 64/01* (2025.01)
*H01L 21/02* (2006.01)
*H01L 21/762* (2006.01)
*H01L 21/768* (2006.01)
*H10B 10/00* (2023.01)
(Continued)

(52) U.S. Cl.
CPC ..... *H10D 64/021* (2025.01); *H01L 21/02293* (2013.01); *H01L 21/76264* (2013.01); *H01L 21/76897* (2013.01); *H10B 10/12* (2023.02); *H10D 64/514* (2025.01); *H10D 86/201* (2025.01)

(58) Field of Classification Search
CPC .. H10D 64/021; H10D 64/514; H10D 86/201; H01L 21/02293; H01L 21/76264; H01L 21/76897; H10B 10/12
See application file for complete search history.

(56) References Cited

U.S. PATENT DOCUMENTS

| 6,242,297 B1 * | 6/2001 | Ishigaki | ................. H10B 10/12 257/E27.099 |
| 8,604,557 B2 * | 12/2013 | Ohkawa | ................. H10B 10/00 365/72 |
| 9,887,211 B2 | 2/2018 | Yamamoto | |

(Continued)

FOREIGN PATENT DOCUMENTS

| JP | 2003-23111 A | 1/2003 |
| JP | 2008-140853 A | 6/2008 |

(Continued)

OTHER PUBLICATIONS

Office Action dated Jul. 1, 2025, issued in corresponding Japan Application No. 2022-078211, 25 pages.

*Primary Examiner* — Eugene Lee
(74) *Attorney, Agent, or Firm* — Rimon P.C.

(57) ABSTRACT

A second gate electrode is adjacent, in a Y direction, to a first tip of a semiconductor layer in a first active region such that a protruding distance of a second tip of the second gate electrode protruded, in a X direction, from the semiconductor layer in the first active region is greater than or equal to 0. Also, the first tip of the semiconductor layer in the first active region is covered with a second sidewall spacer. Further, a first epitaxial layer and the second gate electrode are electrically connected to each other via a first shared contact plug formed so as to across the first epitaxial layer, the second sidewall spacer and the second gate electrode.

12 Claims, 25 Drawing Sheets

(51) Int. Cl.
*H10D 64/27* (2025.01)
*H10D 86/00* (2025.01)

(56) References Cited

U.S. PATENT DOCUMENTS

| | | | | |
|---|---|---|---|---|
| 10,096,608 | B2* | 10/2018 | Morimoto | G06F 30/392 |
| 10,658,385 | B2* | 5/2020 | Becker | H10D 89/10 |
| 11,239,255 | B1* | 2/2022 | Xie | H10D 86/01 |
| 2003/0006444 | A1 | 1/2003 | Amo et al. | |
| 2008/0128825 | A1 | 6/2008 | Sato et al. | |
| 2008/0311718 | A1 | 12/2008 | Futase | |
| 2015/0008522 | A1* | 1/2015 | Iwamatsu | H10B 10/18 |
| | | | | 257/347 |
| 2015/0187905 | A1* | 7/2015 | Cai | H10D 64/514 |
| | | | | 257/288 |
| 2016/0141289 | A1* | 5/2016 | Aono | H10D 84/017 |
| | | | | 438/296 |
| 2017/0140812 | A1* | 5/2017 | Yamamoto | G11C 11/419 |
| 2019/0393248 | A1* | 12/2019 | Tsuboi | H10D 30/0278 |
| 2024/0306362 | A1* | 9/2024 | Wang | H10B 10/125 |
| 2025/0294716 | A1* | 9/2025 | Chen | H10D 84/013 |

FOREIGN PATENT DOCUMENTS

| | | |
|---|---|---|
| JP | 2008-311457 A | 12/2008 |
| JP | 2014-236097 A | 12/2014 |

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2022-078211 filed on May 11, 2022, including the specification, drawings and abstract is incorporated herein by reference in its entirety.

BACKGROUND

The present disclosure relates to a semiconductor device and a method of manufacturing the same, and for example, to a semiconductor device and a method of manufacturing the same using an SOI substrate.

As a semiconductor device for low power consumption, there is a technique for forming a MISFET (Metal Insulator Semiconductor Field Effect Transistor) on an SOI (Silicon On Insulator) substrate including a semiconductor substrate, an insulating layer formed on the semiconductor substrate, and a semiconductive layer formed on the insulating layer. In the MISFET formed on the SOI substrate, the parasitic capacitance caused by a diffusion region to be formed in the semiconductor layer can be reduced. Therefore, it is possible to improve the operation speed and a low power dissipation of the MISFET.

Here, there are disclosed techniques listed below. [Patent Document 1] Japanese Unexamined Patent Application Publication No. 2014-236097

For example, Patent Document 1 discloses a technique in which a plurality of MISFETs is formed on an SOI substrate and SRAM (Static Random Access Memory) circuit is formed by these MISFETs.

SUMMARY

In some cases, when a plug is formed on the semiconductor layer, the plug may be located on a boundary between the semiconductor layer and the element isolation portion as a problem of the SOI substrate. In such a case, the plug penetrates through the insulating layer and reaches an inner portion of the element isolation portion, thereby contacts the semiconductor substrate. Also, this causes a leakage defect in which the semiconductor layer and the semiconductor substrate are electrically connected with each other.

Patent Document 1 discloses a technique for forming an epitaxial layer to be formed on the semiconductor layer so as to protrude from a side surface of the semiconductor layer in order to prevent such a leakage defect. By this technique, even if the plug reaches the inner portion of the element isolation portion, it is possible to prevent the plug from contacting the semiconductor substrate.

However, the ease of growth of the epitaxial layer is affected by the crystal orientation of the underlying semiconductor layer. Therefore, there is a problem that it is difficult to form the epitaxial layer having a uniform width on the entire side surface of the semiconductor layer. In other words, there is a possibility that the plug is contacted with the semiconductor substrate at a portion where the width of the epitaxial layer is thinned. It is an object of the present application to provide a technique for preventing a semiconductor substrate from being contacted by a plug and improving the reliability of a semiconductor device.

Other objects and novel features will become apparent from the description of this specification and the accompanying drawings.

The typical ones of the embodiments disclosed in the present application will be briefly described as follows.

A semiconductor device according to one embodiment, includes: an SOI substrate including a semiconductor substrate, an insulating layer formed on the semiconductor substrate, and a semiconductor layer formed on the insulating layer; an element isolation portion penetrating through the semiconductor layer and the insulating layer such that a bottom portion of the element isolation portion reaches an inner portion of the semiconductor substrate; a first active region partitioned by the element isolation portion and extending in a first direction in plan view, in the SOI substrate; a second active region partitioned by the element isolation portion, extending in the first direction in plan view, and adjacent to the first active region via the element isolation portion in a second direction intersecting with the first direction in plan view, in the SOI substrate; a first MISFET formed in the first active region; and a second MISFET formed in the second active region. Here, the first MISFET includes: a first gate insulating film formed on the semiconductor layer in the first active region; a first gate electrode formed on the first gate insulating film and the element isolation portion so as to extend in the second direction; a first sidewall spacer formed on a side surface of the first gate electrode; a first channel region located beneath the first gate electrode, in the semiconductor layer in the first active region; and a first epitaxial layer formed on the semiconductor layer located next to the first channel region. Also, the second MISFET includes: a second gate insulating film formed on the semiconductor layer in the second active region; a second gate electrode formed on the second gate insulating film and the element isolation portion so as to extend in the second direction; a second sidewall spacer formed on a side surface of the second gate electrode; a second channel region located beneath the second gate electrode, in the semiconductor layer in the second active region; and a second epitaxial layer formed on the semiconductor layer located next to the second channel region. Also, the semiconductor layer in the first active region has a first end portion having a first distal end farthest from the first gate electrode in a third direction, the third direction being a direction toward the second gate electrode from the first gate electrode in the first direction. Also, the second gate electrode has a second end portion having a second distal end farthest from the second active region in a fourth direction, the fourth direction being a direction toward the first active region from the second active region in the second direction. Also, in plan view, the second gate electrode is adjacent, in the first direction, to the first distal end of the semiconductor layer in the first active region such that a protruding distance of the second distal end protruded, in the second direction, from the semiconductor layer in the first active region is greater than or equal to 0. Also, the first distal end of the semiconductor layer in the first active region is covered with the second sidewall spacer. Further, the first epitaxial layer and the second gate electrode are electrically connected to each other via a first shared contact plug formed so as to across the first epitaxial layer, the second sidewall spacer and the second gate electrode.

A semiconductor device according to one embodiment, includes: an SOI substrate including a semiconductor substrate, an insulating layer formed on the semiconductor substrate, and a semiconductor layer formed on the insulating layer; an element isolation portion penetrating through the semiconductor layer and the insulating layer such that a bottom portion of the element isolation portion reaches an inner portion of the semiconductor substrate; a first active region partitioned by the element isolation portion and extending in a first direction in plan view, in the SOI substrate; a second active region partitioned by the element isolation portion, extending in the first direction in plan view, and adjacent to the first active region via the element isolation portion in a second direction intersecting with the first direction in plan view, in the SOI substrate; a first MISFET formed in the first active region; and a second MISFET formed in the second active region. Here, the first MISFET includes: a first gate insulating film formed on the semiconductor layer in the first active region; a first gate electrode formed on the first gate insulating film and the element isolation portion so as to extend in the second direction; a first sidewall spacer formed on a side surface of the first gate electrode; a first channel region located beneath the first gate electrode, in the semiconductor layer in the first active region; and a first epitaxial layer formed on the semiconductor layer located next to the first channel region. Also, the second MISFET includes: a second gate insulating film formed on the semiconductor layer in the second active region; a second gate electrode formed on the second gate insulating film and the element isolation portion so as to extend in the second direction; a second sidewall spacer formed on a side surface of the second gate electrode; a second channel region located beneath the second gate electrode, in the semiconductor layer in the second active region; and a second epitaxial layer formed on the semiconductor layer located next to the second channel region. Also, the second gate electrode and the second sidewall spacer are located on the semiconductor layer in the first active region. Further, the first epitaxial layer and the second gate electrode are electrically connected to each other via a first shared contact plug formed so as to across the first epitaxial layer, the second sidewall spacer and the second gate electrode.

A method of manufacturing a semiconductor device according to one embodiment, comprising steps of: (a) providing an SOI substrate including a semiconductor substrate, an insulating layer formed on the semiconductor substrate, and a semiconductor layer formed on the insulating layer; (b) by forming an element isolation portion penetrating through the semiconductor layer and the insulating layer such that a bottom portion of the element isolation portion reaches an inner portion of the semiconductor substrate, in the SOI substrate, forming a first active region partitioned by the element isolation portion and extending in a first direction in plan view, and forming a second active region partitioned by the element isolation portion, extending in the first direction in plan view, and adjacent to the first active region via the element isolation portion in a second direction intersecting with the first direction in plan view; (c) forming a first gate insulating film of a first MISFET on the semiconductor layer in the first active region, and forming a second gate insulating film of a second MISFET on the semiconductor layer in the second active region; (d) forming a first conductive film on the first gate insulating film, the second gate insulating film and the element isolation portion; (e) forming a first insulating film on the first conductive film; (f) by patterning each of the first insulating film and the first conductive film, forming both a first gate electrode of the first MISFET and a first cap film located on the first gate electrode on each of the first gate insulating film and the element isolation portion, and forming both a second gate electrode of the second MISFET and a second cap film located on the second gate electrode on each of the second gate insulating film and the element isolation portion; (g) forming a first dummy sidewall spacer on a side surface of the first gate electrode, and forming a second dummy sidewall spacer on a side surface of the second gate electrode; (h) forming a first epitaxial layer on the semiconductor layer, which is exposed from the first dummy sidewall spacer, in the first active region, and forming a second epitaxial layer on the semiconductor layer, which is exposed from the second dummy sidewall spacer, in the second active region; (i) after the step of (h), removing the first cap film, the second cap film, the first dummy sidewall spacer and the second dummy sidewall spacer; (j) after the step of (i), forming a first sidewall spacer on the side surface of the first gate electrode, and forming a second sidewall spacer on the side surface of the second gate electrode; (k) forming an interlayer insulating film on the first epitaxial layer, the second epitaxial layer and the element isolation portion so as to cover the first gate electrode, the first sidewall spacer, the second gate electrode and the second sidewall spacer; (l) forming a first shared contact hole in the interlayer insulating film, and forming a second shared contact hole in the interlayer insulating film, the first shared contact hole reaching each of the first epitaxial layer and the second gate electrode, and the second shared contact hole reaching each of the second epitaxial layer and the first gate electrode; and (m) forming a first shared contact plug in the first shared contact hole, and forming a second shared contact plug in the second shared contact hole. Here, the first gate electrode is formed on each of the first gate insulating film and the element isolation portion so as to extend in the second direction in plan view. Also, the second gate electrode is formed on each of the second gate insulating film and the element isolation portion so as to extend in the second direction in plan view. Also, the semiconductor layer in the first active region has a first end portion having a first distal end farthest from the first gate electrode in a third direction, the third direction being a direction toward the second gate electrode from the first gate electrode in the first direction. Also, the semiconductor layer in the second active region has a third end portion having a third distal end farthest from the second gate electrode in a fifth direction, the fifth direction being a direction toward the first gate electrode from the second gate electrode in the first direction. Also, the first gate electrode has a fourth end portion having a fourth distal end farthest from the first active region in a sixth direction, the sixth direction being a direction toward the second active region from the first active region in the second direction. Also, the second gate electrode has a second end portion having a second distal end farthest from the second active region in a fourth direction, the fourth direction being a direction toward the first active region from the second active region in the second direction. Also, in plan view, the second gate electrode is adjacent, in the first direction, to the first distal end of the semiconductor layer in the first active region such that a protruding distance of the second distal end protruded, in the second direction, from the semiconductor layer in the first active region is greater than or equal to 0. Also, the first distal end of the semiconductor layer in the first active region is covered with the second sidewall spacer. Also, in plan view, the first gate electrode is adjacent, in the first direction, to the third distal end of the semiconductor layer in the second active region such that a protruding distance of the fourth distal end protruded, in the second direction, from the semiconductor layer in the second active region is greater than or equal to 0. Also, the third distal end of the semiconductor layer in the second active region is covered with the first sidewall spacer. Also, the first shared contact plug is formed so as to across the first epitaxial layer, the second sidewall spacer and the second gate electrode. Further, the second shared contact plug is formed so as to across the second epitaxial layer, the first sidewall spacer and the first gate electrode.

According to one embodiment, the reliability of the semiconductor device can be improved.

DETAILED DESCRIPTION

Figure 1:
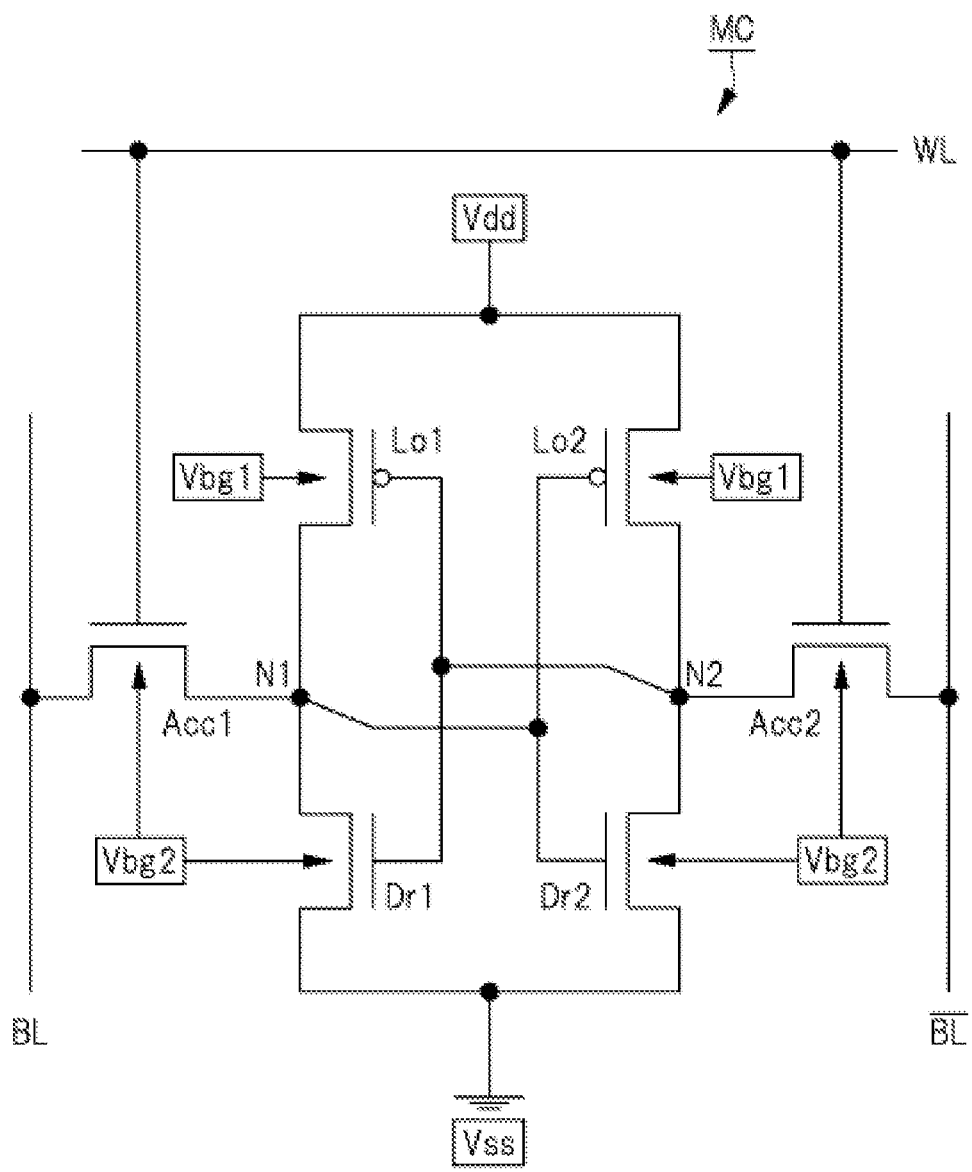
FIG. 1 is a circuit diagram showing a memory cell of a semiconductor device according to a first embodiment.

In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In addition, "X direction", "Y direction", and "Z direction" described in the present application intersect each other and are orthogonal to each other. In the present application, the Z direction is referred to as a vertical direction, a height direction or a thickness direction of a structure. In addition, the expression of "planar view" or "plan view" used in the present application means the surface configured by the X direction and the Y direction is a "plane", and means the surface viewed from the Z direction.

First Embodiment

Structure of Semiconductor Device

Figure 2:
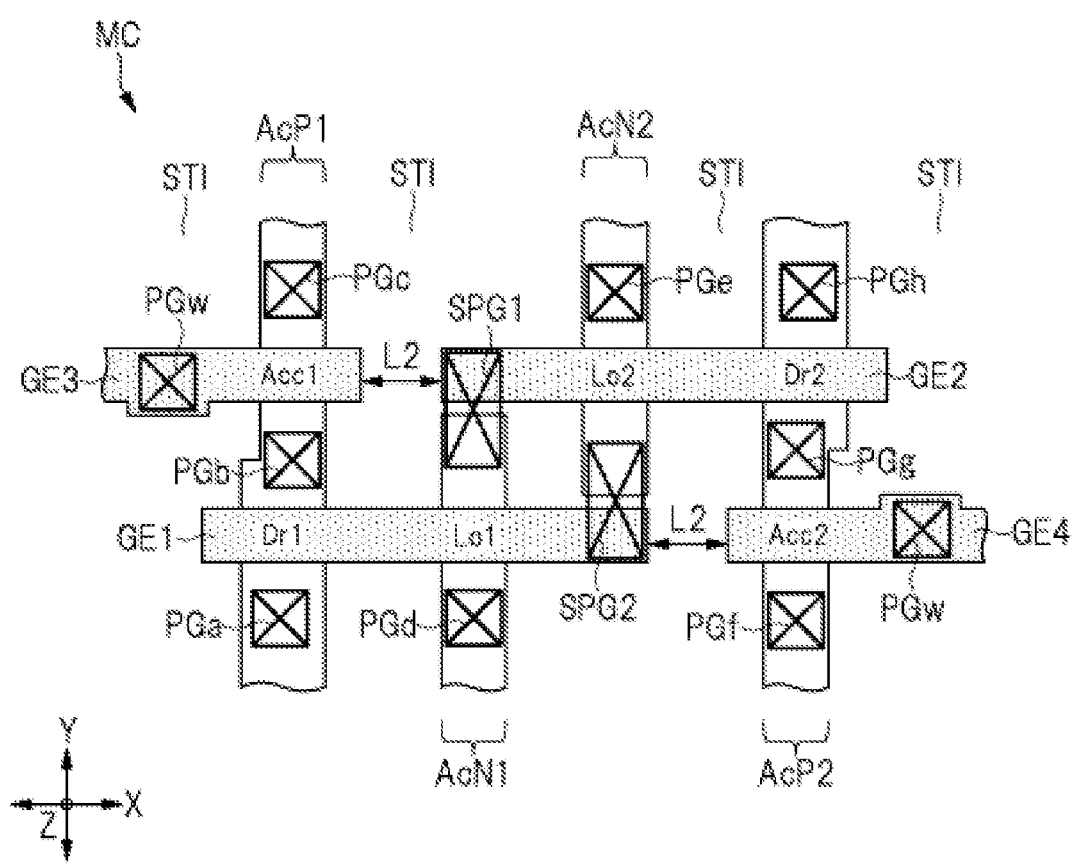
FIG. 2 is a plan view showing the memory cell of the semiconductor device according to the first embodiment.

A semiconductor device according to a first embodiment will be described below with reference to FIGS. 1 to 4. The semiconductor device includes SRAM circuit. The SRAM circuit comprises a plurality of memory cells MC as shown in FIGS. 1 and 2. FIG. 1 is a circuit diagram showing the memory cell MC. FIG. 2 is a plan view showing the memory cell MC.

As shown in FIG. 1, the memory cell MC is arranged at an intersection of a pair of bit lines BL, /(bar)BL and a word line WL. The memory cell MC has a pair of load transistors (MISFET for load) Lo1, Lo2, a pair of access transistors (MISFET for transfer) Acc1, Acc2 and a pair of driver transistors (MISFET for drive) Dr1, Dr2. The load transistor Lo1, Lo2 is a p-channel MISFET, and the access transistor Acc1, Acc2 and the driver transistor Dr1, Dr2 are n-channel MISFET.

Of the six MISFET constituting the memory cell MC, the load transistor Lo1 and the driver transistor Dr1 constitute a CMOS inverter, and the load transistor Lo2 and the driver transistor Dr2 constitute another CMOS inverter. Nodes N1 and N2, which are mutually input and output terminals of these pair of CMOS inverters, are cross-coupled and constitute a flip-flop circuit as an information storage unit for storing 1-bit information.

The connection of the 6 MISFET will be described below.

A load transistor Lo1 is connected between the power supply voltage Vdd and node N1, a driver transistor Dr1 is connected between node N1 and reference voltage Vss, a gate electrode of each of the load transistor Lo1 and the driver transistor Dr1 is connected to node N2. A load transistor Lo2 is connected between the power supply voltage Vdd and node N2, a driver transistor Dr2 is connected between node N2 and reference voltage Vss, the gate electrode of each of the load transistor Lo2 and the driver transistor Dr2 is connected to node N1.

An access transistor Acc1 is connected between the bit line BL and the node N1, an access transistor Acc2 is connected between the bit line/BL and the node N2, and the gate electrode of each of the access transistor Acc1 and the access transistor Acc2 is connected to the word line WL.

The relationship between the circuit diagram of FIG. 1 and each plug shown in FIG. 2 will be described.

The plug PGa is provided between the driver transistor Dr1 and reference voltage Vss, and the plug PGb is provided between the driver transistor Dr1 and the access transistor Acc1. The plug PGc is provided between the access transistor Acc1 and the bitline BL, and the plug PGd is provided between the load transistor Lo1 and the power supply Vdd.

The plug PGh is provided between the driver transistor Dr2 and reference voltage Vss, and the plug PGg is provided between the driver transistor Dr2 and the access transistor Acc2. The plug PGf is provided between the access transistor Acc2 and the bitline /BL, and the plug PGe is provided between the load transistor Lo2 and the power supply Vdd.

The shared contact plug (plug) SPG1 is formed so as to across the gate electrode GE2 of each of the load transistor Lo2 and the driver transistor Dr2 and the drain region of the load transistor Lo1, and is electrically connected to the plug PGb by a wire (not shown). The shared contact plug (plug) SPG2 is formed so as to across the gate electrode GE1 of each of the load transistor Lo1 and the driver transistor Dr1 and the drain region of the load transistor Lo2, and is electrically connected to the plug PGg by a wire (not shown).

One plug PGw is connected to the gate electrode GE3 of the access transistor Acc1 and is provided between the access transistor Acc1 and the word line WL. The other plug PGw is connected to the gate electrode GE4 of the access transistor Acc2 and is provided between the access transistor Acc2 and the word line WL.

The six MISFETs are formed in an SOI substrate 10 including a semiconductor substrate SUB, an insulating layer BOX, and a semiconductor layer SL. The SOI substrate 10 is partitioned into a plurality of active regions by the element isolation portion STI. In the memory cell MC, the SOI substrate 10 is partitioned into active regions AcP1, AcP2, AcN1, AcN2. The active regions AcP1, AcP2, AcN1, AcN2 extend in the Y direction, respectively, and adjoin each other in the X direction via the element isolation portions STI. In the X direction, the active region AcN1 is adjacent to the active region AcN2 and the active region AcP1, and the active region AcN2 is adjacent to the active region AcN1 and the active region AcP2. By arranging the active regions AcP1, AcP2, AcN1, AcN2 in a folded manner, a memory cell array including a plurality of memory cells MC is formed.

Further, the thickness of the semiconductor layer SL is thin, since about 10 nm, the epitaxial layer EP is formed on the semiconductor layer SL. A well region of p-type is formed in semiconductor substrate SUB in each active region AcP1, AcP2, and a well region of n-type is formed in the semiconductor substrate SUB in each active region AcN1, AcN2.

The load transistor Lo1 is formed in the active region AcN1, the load transistor Lo2 is formed in the active region AcN2, the access transistor Acc1 and the driver transistor Dr1 are formed in the active region AcP1, and the access transistor Acc2 and the driver transistor Dr2 are formed in the active region AcP2.

A back-gate voltage Vbg1 is applied to the n-type well region NW in the active region AcN1, AcN2, and a back-gate voltage Vbg2 different from the back-gate voltage Vbg1 is applied to the p-type well region in the active region AcP1, AcP2.

The threshold of the load transistor Lo1 is controlled by the voltage applied to the gate electrode GE1 and the back gate voltage Vbg1. The threshold of the load transistor Lo2 is controlled by the voltage applied to the gate electrode GE2 and the back gate voltage Vbg1. The threshold of the access transistor Acc1 is controlled by the voltage applied to the gate electrode GE3 and the back gate voltage Vbg2. The threshold of the access transistor Acc2 is controlled by the voltage applied to the gate electrode GE4 and the back gate voltage Vbg2. The threshold of the driver transistor Dr1 is controlled by the voltage applied to the gate electrode GE1 and the back gate voltage Vbg2. The threshold of the driver transistor Dr2 is controlled by the voltage applied to the gate electrode GE2 and the back gate voltage Vbg2.

Structure of Memory Cell MC

Figure 3:
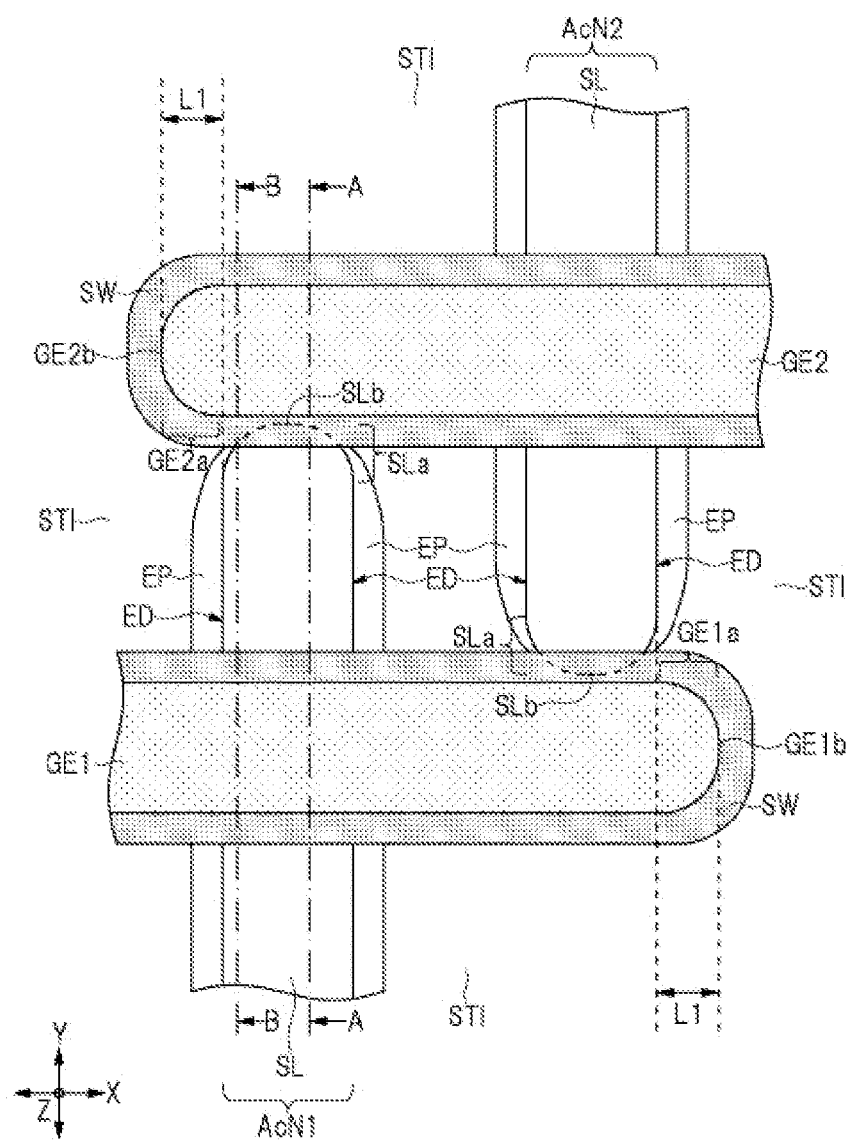
FIG. 3 is a plan view showing a part of the memory cell of the semiconductor device according to the first embodiment.
Figure 4:
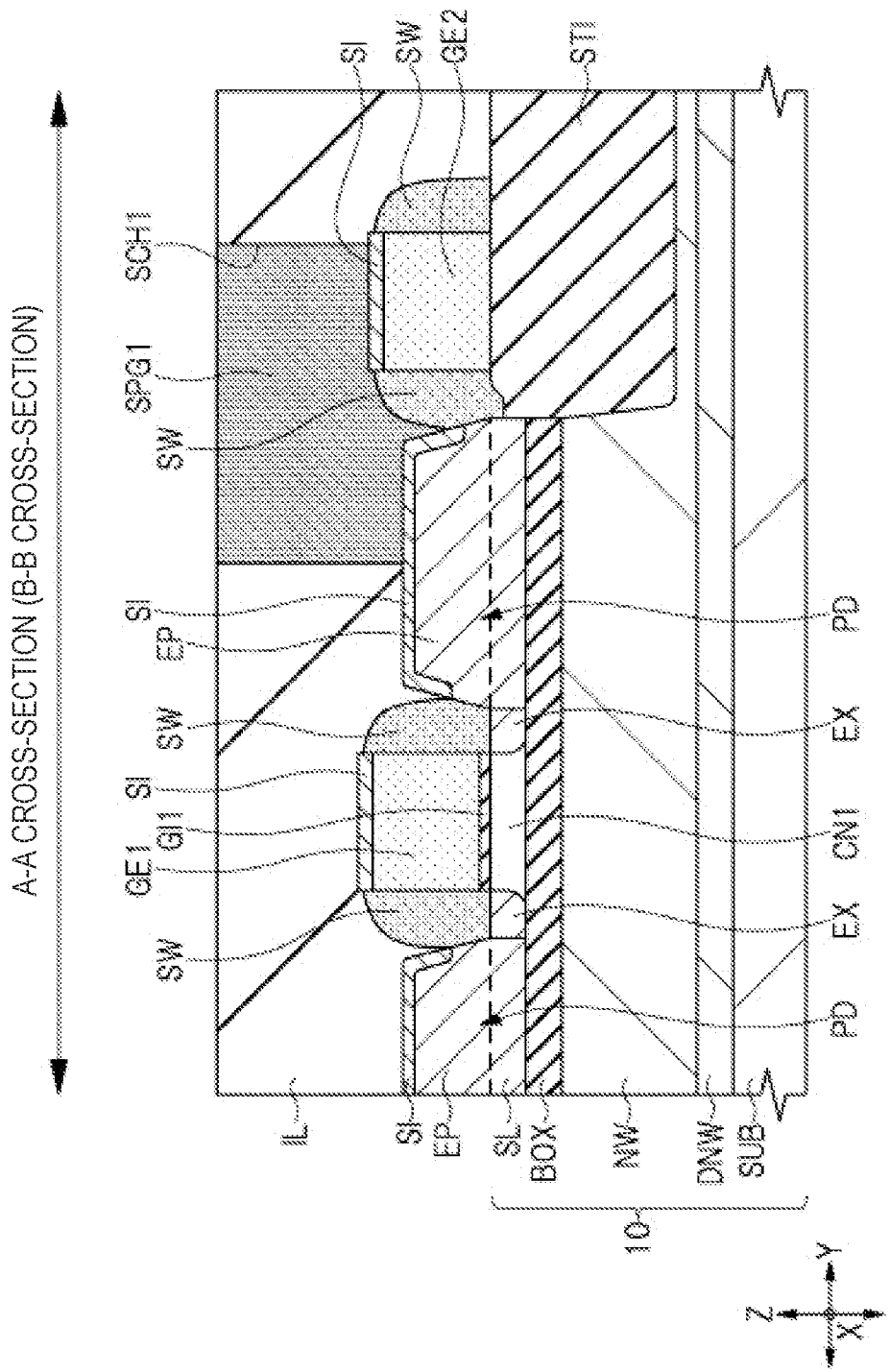
FIG. 4 is a cross-sectional view showing the part of the memory cell of the semiconductor device according to the first embodiment.

FIG. 3 is a partial enlarged plan view around each load transistor Lo1, Lo2 shown in FIG. 2. FIG. 4 is a cross-sectional view along A-A line shown in FIG. 3. Since the cross-sectional view along B-B line shown in FIG. 3 is substantially the same as the cross-sectional view shown in FIG. 4, the cross-sectional view along A-A line will be described hereinafter.

Further, in FIG. 4, the cross-sectional structure around the load transistor Lo1 and the shared contact plug SPG1 is mainly described, but the cross-sectional structure around the load transistor Lo2 and the shared contact plug SPG2 is also the same as in FIG. 4 except that the reference numerals and the like differ. The load transistor Lo1, Lo2 is a MISFET of p-type, and the access transistor Acc1, Acc2 and the driver transistor Dr1, Dr2 are a MISFET of n-type. Therefore, the cross-sectional configurations of the access transistor Acc1, Acc2 and the driver transistor Dr1, Dr2 are obtained by reversing the conductivity types of the respective configurations shown in FIG. 4.

As shown in FIG. 4, the SOI substrate 10 includes a semiconductor substrate SUB that is a support substrate, the insulating layer BOX formed on semiconductor substrate SUB, and a semiconductive layer SL formed on the insulating layer BOX.

The semiconductor substrate SUB is made of, for example, monocrystalline silicon of p-type. The insulating layers BOX are made of, for example, silicon oxide. The thickness of the insulating layers BOX is, for example, 10 nm to 20 nm. The semiconductor layer SL are made of monocrystalline silicon. The thickness of the semiconductor layer SL is, for example, 10 nm to 20 nm. The semiconductor layer SL is an intrinsic semiconductor layer into which an n-type or p-type impurity is not introduced by ion-implantation or the like. Even if a p-type impurity is introduced into the semiconductor layer SL, the impurity density is $1 \times 10^{13}/cm^3$ or less.

In the SOI substrate 10, a plurality of element isolation portions STI are formed. The element isolation portion STI penetrates the semiconductor layer SL and the insulating layer BOX. The bottom of the element isolation portion STI is located at an inner portion of the semiconductor substrate SUB. The element isolation portion STI includes a trench formed in the SOI substrate 10 and an insulating film embedded in the trench. The insulating film is, for example, a silicon oxide film.

An n-type well area DNW is formed in semiconductor substrate SUB. In the well region DNW, an n-type well region NW is formed. Although not shown, a well region DNW is also formed in semiconductor substrate SUB in the active region AcP1, AcP2, and a p-type well region is formed in the well region DNW. The well region DNW electrically isolates the well region NW from the other well regions.

A gate insulating film GI1 is formed on the semiconductor layer SL. A gate electrode GE1 is formed on the gate insulating film GI1. The gate insulating film GI1 is, for example, a silicon oxide film. The gate-electrode GE1 is a conductive film, for example, a p-type doped polycrystalline silicon film. A portion of the semiconductor layer SL in the active region AcN1 located beneath the gate electrode GE1 serves as a channel region CN1 of the load transistor Lo1.

A sidewall spacer SW is formed on a side surface of the gate electrode GE1. The sidewall spacer SW is formed of an insulating film, and is, for example, a stacked film of a silicon oxide film and a silicon nitride film formed on the silicon oxide film. An extension region EX, which is a p-typed impurity region of low concentration, is formed in the semiconductor layer SL beneath the sidewall spacer SW.

As shown in FIG. 3, the gate electrode GE1 and the gate electrode GE2 are also formed on the element isolation portion STI so as to extend in the X direction. The sidewall spacers SW formed on the side surfaces of the gate electrode GE1 and the gate electrode GE2 also extend in the X direction.

In addition, the semiconductor layers SL in each active region AcN1, AcN2 has an end portion SLa having a tip (distal end) SLb. The end portion SLa of the semiconductor layer SL is rounded like a semicircular shape, and becomes thinner toward the tip SLb. That is, the width of the end portion SLa (that is, the length of the end portion SLa in the X direction) is less than the width of the channel region CN1 (in other words, the width of the semiconductor layer SL located beneath the gate electrode GE1 or beneath the gate electrode GE2).

In the first embodiment, the gate electrode GE2 is adjacent, in the Y direction, to the tip SLb of the semiconductor layer SL in the active region AcN1. Also, the gate electrode GE1 is adjacent, in the Y direction, to the tip SLb of the semiconductor layer SL in the active region AcN2.

An epitaxial layer EP is formed on the semiconductor layer SL located next to the channel region CN1. In the epitaxial layer EP and the semiconductor layer SL, a diffusion region PD which is a p-type impurity region having a higher concentration than the extension region EX is formed. The extension region EX and the diffusion region PD constitute a source region or a drain region of the load transistor Lo1. Although the semiconductor layer SL and the epitaxial layer EP are actually integrated, they are illustrated separately for ease of explanation.

A silicide layer SI is formed on the gate-electrode GE1 and the epitaxial layer EP. The silicide layers SI are made of, for example, nickel silicide or cobalt silicide.

An interlayer insulating film IL is formed on the epitaxial layer EP and the element isolation portion STI so as to cover the gate electrode GE1 and the sidewall spacer SW. The interlayer insulating film IL is, for example, a silicon oxide film.

In the interlayer insulating film IL, a shared contact hole SCH1 that reaches the epitaxial layer EP of the active area AcN1 and the gate-electrode GE2 is formed. A shared contact plug SPG1 is formed in the shared contact hole SCH1. In the active region AcN2, a shared contact hole that reaches the epitaxial layers EP and the gate electrode GE1 is also formed, and a shared contact plug SPG2 is formed in the shared contact hole of the active region AcN2.

The shared contact plug SPG1, SPG2 is formed by the same material and the same manufacturing process as the respective plug PGa~PGh, PGw shown in FIG. 2, and is, for example, a laminated film of a barrier metal film and a tungsten film formed on the barrier metal film. The barrier metal film is, for example, a titanium film or a titanium nitride film, or a laminated film thereof.

The shared contact plug SPG1 is formed across the epitaxial layer EP, the sidewall spacer SW, and the gate electrode GE2 of the active region AcN1, and the epitaxial layer EP and the gate electrode GE2 of the active region AcN1 are connected by the shared contact plug SPG1. Further, the shared contact plug SPG2 is formed across the epitaxial layer EP, the sidewall spacer SW, and the gate electrode GE1 of the active region AcN2, and the epitaxial layer EP and the gate electrode GE1 of the active region AcN2 are connected by the shared contact plug SPG2.

Problems of Examined Example and Major Features of First Embodiment

Figure 22:
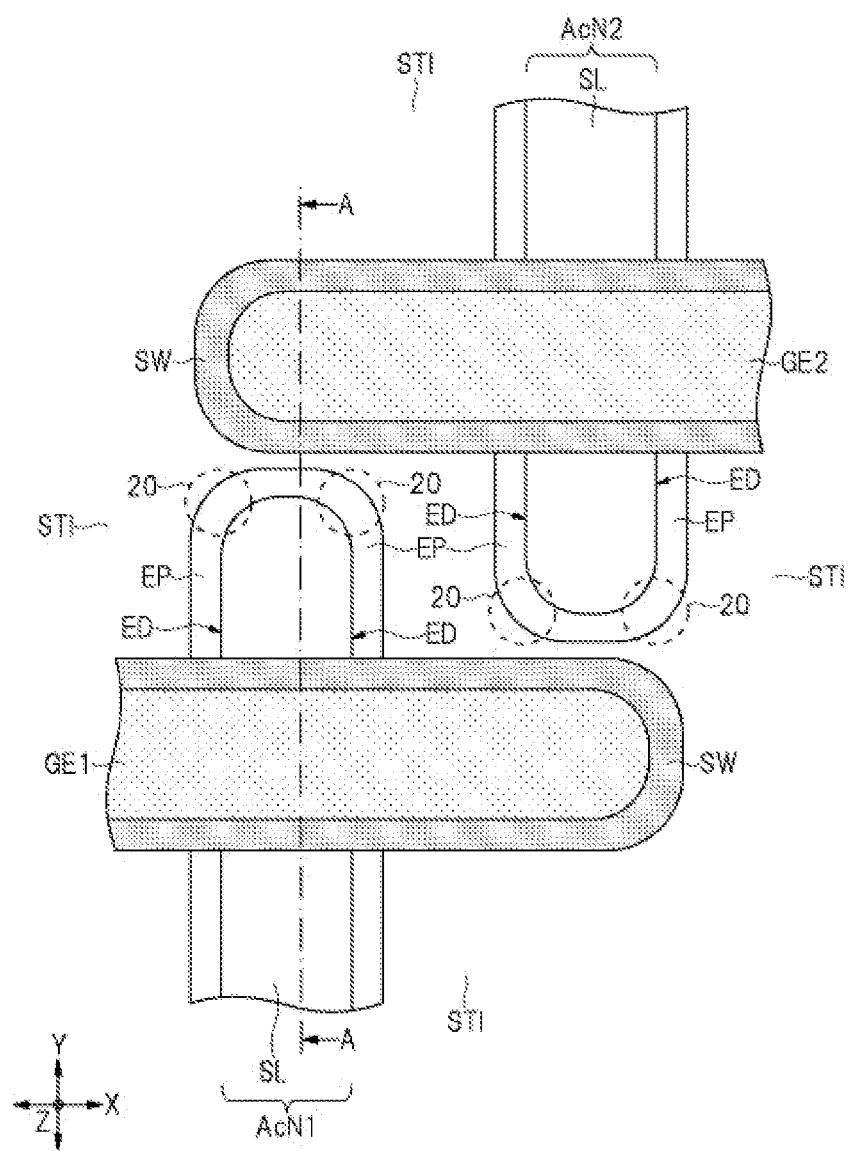
FIG. 22 is a plan view showing a part of a memory cell of a semiconductor device according to a first examined example.
Figure 23:
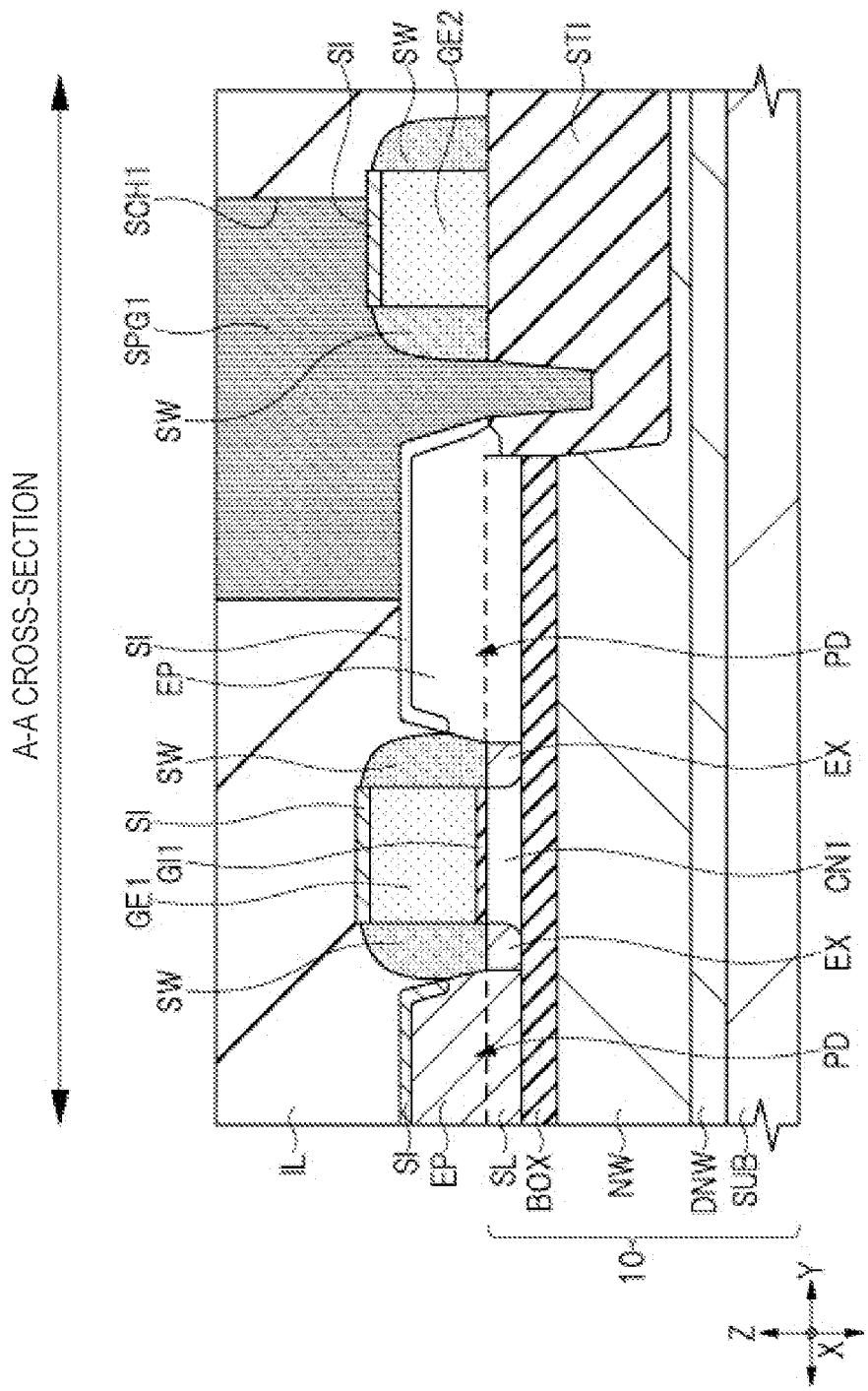
FIG. 23 is a cross-sectional view showing the part of the memory cell of the semiconductor device according to the first examined example.
Figure 24:
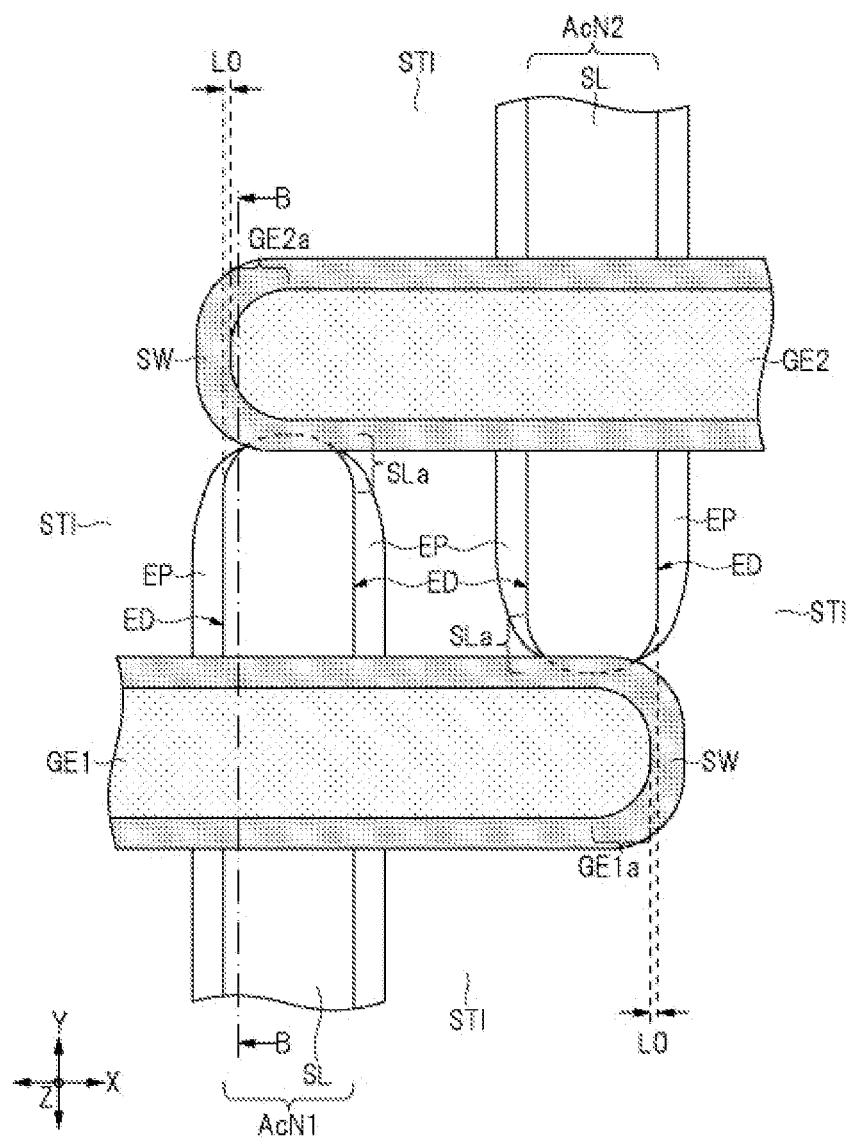
FIG. 24 is a plan view showing a part of a memory cell of a semiconductor device according to a second examined example.
Figure 25:
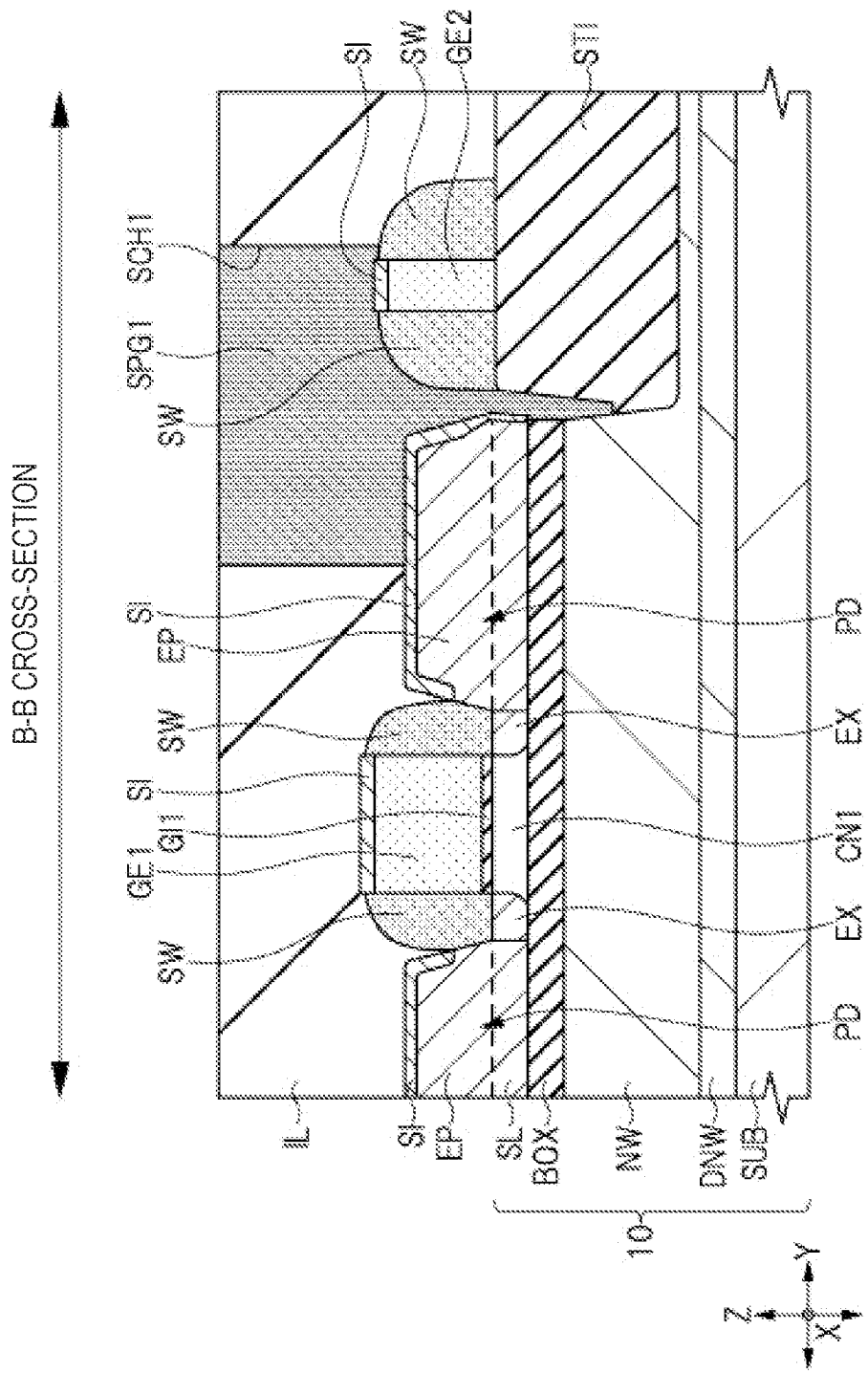
FIG. 25 is a cross-sectional view showing the part of the memory cell of the semiconductor device according to the second examined example.

A memory cell MC according to each of a first examined example and a second examined example that were studied by the inventors of the present application and their problems will be described below with reference to FIGS. 22 to 25. FIG. 22 and FIG. 23 show the memory cell MC according to the first examined example, and FIG. 24 and FIG. 25 show the memory cell MC according to the second examined example.

As shown in FIGS. 22 and 23, in the first examined example, the epitaxial layer EP is formed so as to protrude from the interface between the semiconductor layer SL and the element isolation portion STI (refer to FIG. 23) toward the element isolation portion STI. In other words, a part of the epitaxial layer EP is also formed on the element isolation portion STI, and a part of the epitaxial layer EP overlaps the element isolation portion STI in a plan view. The amount of protrusion is, for example, 5 nm to 10 nm. Such a configuration is the same in first embodiment.

In order to form the epitaxial layers EP as described above, the technique disclosed in Patent Document 1 can be used. By setting the plane orientation of the semiconductor layer SL to (100) and the channel orientation to <100>, it is possible to easily grow the epitaxial layer EP toward the element isolation portion STI.

In the first examined example, since the epitaxial layer EP is formed as described above, the epitaxial layer EP can serve as an eaves. For example, as shown in FIG. 23, even when the semiconductor layer SL of the active region AcN1 and the gate electrode GE2 are spaced apart from each other to some extent, and the shared contact plug SPG1 is positioned on the boundary between the semiconductor layer SL and the element isolation portion STI, the interface is covered with a part of the epitaxial layer EP (an eaves-like portion). Therefore, the shared contact plug SPG1 does not contact semiconductor substrate SUB. Therefore, it is possible to suppress a leakage defect in which SL and semiconductor substrate SUB become conductive.

However, according to studies conducted by the inventors of the present application, it has been found that when the end portion of the semiconductor layer SL is rounded, the epitaxial layer EP is not sufficiently grown at the rounded portion, the width of the epitaxial layer EP is narrowed, or the epitaxial layer EP is not formed. In FIG. 22, such location is illustrated as a thin film portion 20. When the shared contact plug SPG1 is formed above the thin film portion 20, the above-described leakage failure is likely to occur.

In the second examined example shown in FIGS. 24 and 25, the gate electrode GE2 is closer to the semiconductor layer SL of the active region AcN1 than in the first examined example, and the boundary between the semiconductor layer SL and the element isolation portion STI is attempted to be covered by the sidewall spacer SW formed on the side surface of the gate electrode GE2. Here, since the end portion SLa of the semiconductor layer SL is rounded, the width of the epitaxial layer EP in the end portion SLa is narrowed, as described for the thin film portion 20. Further, as shown in FIG. 24, in the second examined example, a tip (distal end) fronGE2b of the gate electrode GE2 is retreated from the semiconductor layer SL of the active region AcN1 in the direction from the active region AcN1 toward the active region AcN2 in the X direction. Further, a tip (distal end) GE1b of the gate electrode GE1 is retracted from the semiconductor layer SL of the active region AcN2 in the direction from the active region AcN2 to the active region AcN1 in the X direction. In FIG. 24, these receding amounts are illustrated as a receding distance L0, and satisfy the relationship of "L1<0" when defined by a protruding distance L1 to be described later.

On the other hand, each end portion GE1a, GE2a of each gate electrode GE1, GE2 is also rounded like a semicircular shape. In designing, the semiconductor layer SL and each gate electrode GE1, GE2 have a rectangular shape, but it is known that when patterning is performed using a photolithography technique during a manufacturing process, a corner portion of a workpiece is easily processed to be rounded. The roundness of the semiconductor layer SL and each gate electrode GE1, GE2 is caused by such a manufacturing process.

The sidewall spacer SW is formed to have a substantially uniform thickness along the side surface of the gate electrode GE1, GE2. Thus, at the end portion GE1a, GE2a, the sidewall spacers SW are gradually separated from the semiconductor layers SL. That is, a portion of the end portion SLa of SL that is exposed from the sidewall spacer SW is present.

Due to these circumstances, when the end portion SLa of the semiconductor layer SL and the end portion GE1a, GE2a of the gate electrode GE1, GE2 come close to each other, there is a portion where the epitaxial layer EP is very narrow, and a portion where the border between the semiconductor layer SL and the element isolation portion STI is not covered by the sidewall spacer SW is likely to exist. B-B lines in FIG. 24 illustrate such locations. FIG. 25 is a cross-sectional view along B-B of FIG. 24.

As shown in FIG. 25, when the shared contact plug SPG1 is formed, the shared contact plug SPG1 contacts both the epitaxial layers EP and semiconductor substrate SUB, and a leakage failure occurs.

The first embodiment has been devised to solve the drawbacks of the first examined example and the second examined example. The main features of the first embodiment will be described below with reference to FIG. 3.

As shown in FIG. 3, the gate electrode GE1 has an end portion GE1a including the tip GE1b, and the gate electrode GE2 has an end portion GE2a including the tip GE2b. In first embodiment as well, the end portion GE1a of the gate electrode GE1 is rounded like a semicircular shape for the reason caused by the above-described manufacturing process, and becomes thinner toward the tip GE1b. That is, the width of the end portion GE1a (that is, the length of the end portion GE1a in the Y direction) is less than the width of a portion, which is located on the channel region CN1 (in other words, the semiconductor layer SL in the active region AcN1), of the gate electrode GE1. Similarly, the end portion GE2a of the gate electrode GE2 is rounded like a semicircular shape, and becomes thinner toward the tip GE2b. That is, the width of the end portion GE2a (that is, the length of the end portion GE2a in the Y direction) is less than the width, which is located on the channel region CN1 (in other words, the semiconductor layer SL in the active region AcN2), of the gate electrode GE2.

In first embodiment, the tip GE2b of the gate-electrode GE2 protrudes from the semiconductor layer SL of the active region AcN1 in a direction from the active region AcN2 toward the active region AcN1 in the X direction. That is, the relationship of "L1>0" is satisfied. The tip GE1b of the gate electrode GE1 protrudes from the semiconductor layer SL of the active region AcN2 in a direction from the active region AcN1 toward the active region AcN2 in the X direction. That is, the relationship of "L1>0" is satisfied. In FIG. 3, these protrusions are illustrated as protruding distance L1.

Hereinafter, structures related to the shared contact plug SPG1 (the semiconductor layer SL of the active region AcN1, the gate electrode GE2, and the like) will be representatively described, but the same applies to structures related to the shared contact plug SPG2 (the semiconductor layer SL of the active region AcN2, the gate electrode GE1, and the like).

As the protruding distance L1 become long (large), the end portion GE2a of the rounded gate electrode GE2 is spaced away from the end portion SLa of the semiconductor layer SL. Therefore, the tip SLb of the semiconductor layer SL is covered with the sidewall spacer SW formed on the side surface of the gate electrode GE2, and the end portion SLa of the semiconductor layer SL is also covered with the sidewall spacer SW. Thus, a cross-sectional view along B-B line shown in FIG. 3 is substantially the same as a cross-sectional view (FIG. 4) along A-A line shown in FIG. 3.

Therefore, even if there is a portion where the epitaxial layers EP are very narrow, such as the thin film portion 20, the portion is easily covered with the sidewall spacer SW. The end portion SLa of the semiconductor layer SL and the isolation portion STI are covered with an eaves-shaped epitaxial layer EP or a sidewall spacer SW. In addition, a part of the epitaxial layers EP is also formed on the element isolation portion STI at a position other than the end portion SLa as described above. That is, the entire border between the semiconductor layer SL and the isolation portion STI is covered with at least one of the epitaxial layer EP and the sidewall spacer SW.

Therefore, for example, even if the shared contact plug SPG1 is not formed at the position shifted, the shared contact plug SPG1 does not touch semiconductor substrate SUB. Therefore, it is possible to suppress a leakage defect in which SL and semiconductor substrate SUB become conductive, and thus it is possible to improve the reliability of semiconductor device.

Note that the gate electrode GE2 may be formed such that the tip GE2b of the gate electrode GE2 is located in the X direction at the same position as the edge ED (that is, the edge ED located on the left side in FIG. 3) of the two edge (side) ED of the semiconductor layer SL of the active region AcN1 that is far from the active region AcN2. That is, it may be a relationship of "L1=0". However, from the viewpoint of reliably covering the end portion SL of the semiconductor layer SLa, as shown in FIG. 3, it is preferable that the entire end portion GE2 end portion GE2a protrudes from the semiconductor layer SL of the active region AcN1 in the X direction, so that the protruding distance L1 is set. That is, it is preferable that the relationship of "L1>0" is satisfied.

On the other hand, referring to FIG. 2, if the protruding distance L1 is too long, the distance L2 between the gate electrode GE2 and the gate electrode GE3 is affected. If the protruding distance L1 is increased and the distance L2 is maintained long, miniaturization of the memory cell MC is impaired. Therefore, the range L2 should be maintained at least at the smallest processing dimension or longer. For example, if the smallest machining dimension was 40 nm to 70 nm, the distance L2 is set to be 40 nm to 70 nm or longer.

Therefore, it is preferable to set the protruding distance L1 as long as possible on the premise that the distance L2 is within the above-described range.

Method of Manufacturing Semiconductor Device

A method of manufacturing the semiconductor device according to the first embodiment will be described below with reference to FIG. 5 to FIG. 12.

Figure 5:
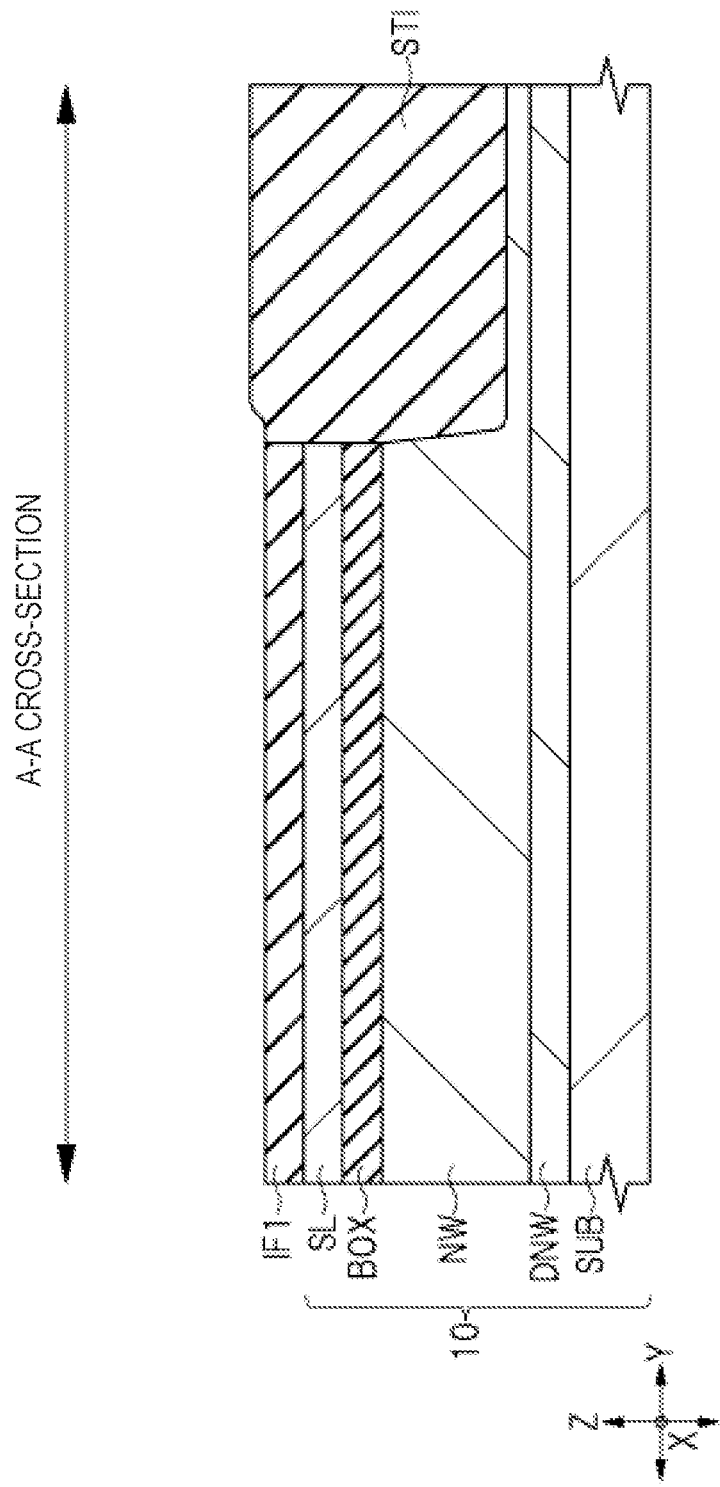
FIG. 5 is a cross-sectional view showing a manufacturing process of the semiconductor device according to the first embodiment.

First, as shown in FIG. 5, the SOI substrate 10 including the semiconductor substrate SUB, the insulating layer BOX formed on the semiconductor substrate SUB, and the semiconductive layer SL formed on the insulating layer BOX is provided.

An exemplary process for preparing such the SOI substrate is described below. SOI substrate can be produced, for example, by a bonding method. In the bonding method, for example, a second semiconductor substrate made of silicon is bonded to the first BOX by pressure bonding at a high temperature after the first semiconductor substrate made of silicon is oxidized to form the insulating layers, and then the second semiconductor substrate is thinned. In this case, the thin film of the second semiconductor substrate remaining over the insulating layer BOX becomes the semiconductor layer SL, the first semiconductor substrate under the insulating layer BOX is the semiconductor substrate SUB.

Next, an insulating film IF1 made of, for example, silicon oxide is formed on the semiconductor layer SL by, for example, CVD (Chemical Vapor Deposition). The thickness of the insulating film IF1 is, for example, 10 nm to 20 nm.

Next, an isolation portion STI penetrating through the semiconductor layer SL and the insulating layer BOX and having a bottom portion located inside semiconductor substrate SUB is formed. Specifically, first, a trench that penetrates the insulating film IF1, the semiconductive layer SL, and the insulating layer BOX and reaches semiconductor substrate SUB is formed. Next, an insulating film such as a silicon oxide film is formed on the insulating film IF1 including the trench. Next, the insulating film located outside the trench is removed by polishing using CMP (Chemical Mechanical Polishing) method. As a result, an isolation portion STI including the groove and the insulating film left in the groove is formed. Further, by forming the element isolation portion STI, the element isolation portion STI partitions the active regions the SOI substrate 10 in the active regions AcP1, AcP2, AcN1, AcN2.

Thereafter, although not shown, the insulating film IF1, the semiconductive layer SL, and the insulating layer BOX are sequentially removed in regions that differ from the memory cell MC. In this process, the insulating film IF1 is removed in the area where the memory cell MC is formed.

Figure 6:
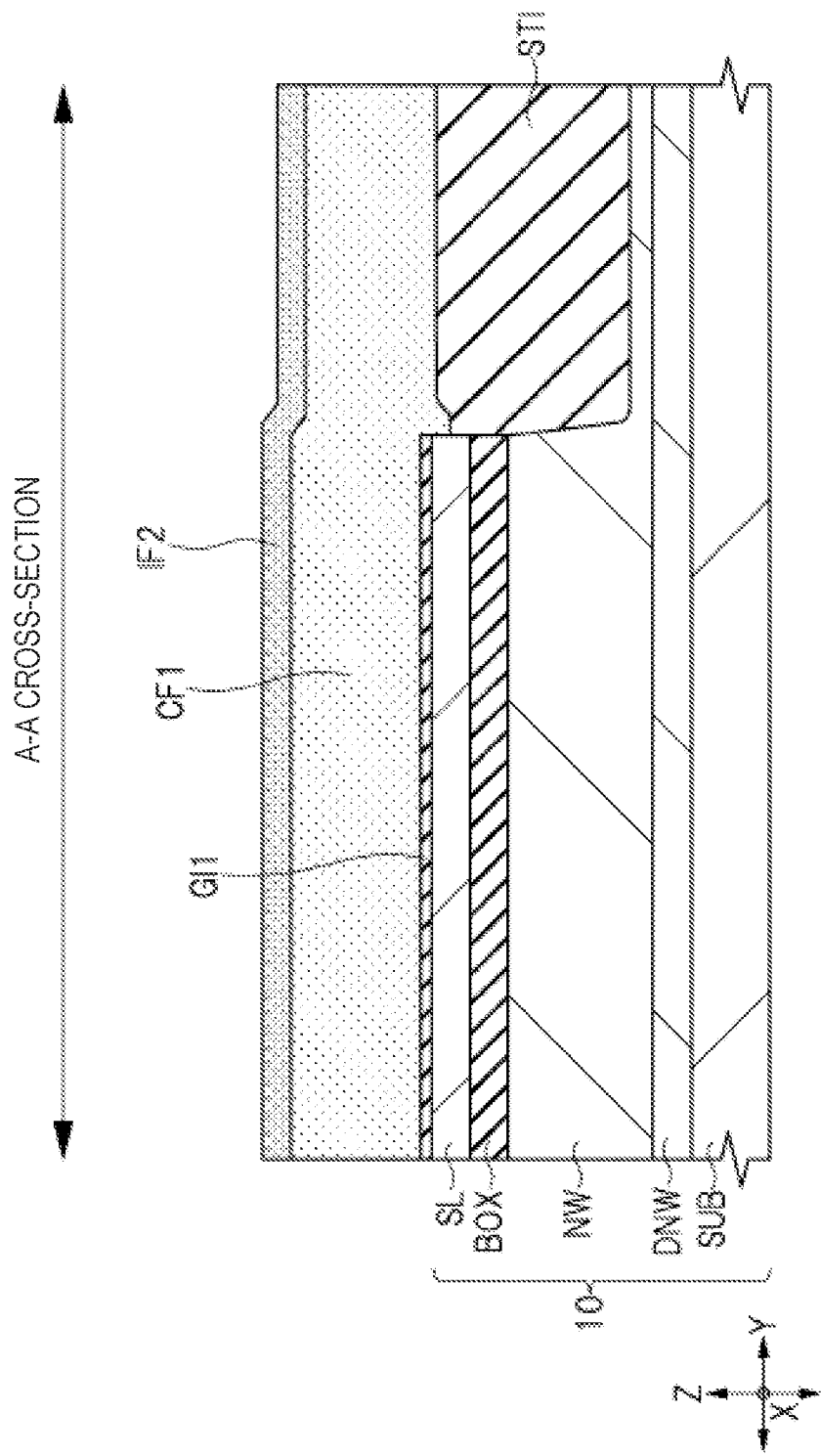
FIG. 6 is a cross-sectional view showing the manufacturing process of the semiconductor device following to FIG. 5.

As shown in FIG. 6, first, a gate insulating film GI1 of the load transistor Lo1 is formed on the semiconductor layer SL of the active region AcN1 by, for example, a thermal oxidation method. Through the same manufacturing process, gate insulating films of the access transistor Acc1 and the driver transistor Dr1 are formed on the semiconductor layer SL of the active region AcP1, gate insulating films of the access transistor Acc2 and the driver transistor Dr2 are formed on the semiconductor layer SL of the active region AcP2, and gate insulating films of the load transistor Lo2 are formed on the semiconductor layer AcN2 of the active region.

Next, a conductive film CF1 such as a polycrystalline silicon film is formed on the gate insulating film GI1, the other gate insulating film, and the element isolation portion STI by, for example, a CVD method. Next, an n-type or p-type impurity is introduced into the conductive film CF1 by photolithography and ion-implantation. A p-type impurity is introduced into the conductive film CF1 which becomes the load transistor Lo1, Lo2 later, and an n-type impurity is introduced into the conductive film CF1 which becomes the access transistor Acc1, Acc2 and the driver transistor Dr1, Dr2 later.

Next, an insulating film IF2 is formed on the conductive film CF1 by, for example, a CVD method. The insulating film IF2 is, for example, a silicon nitride film or a silicon oxide film.

Figure 7:
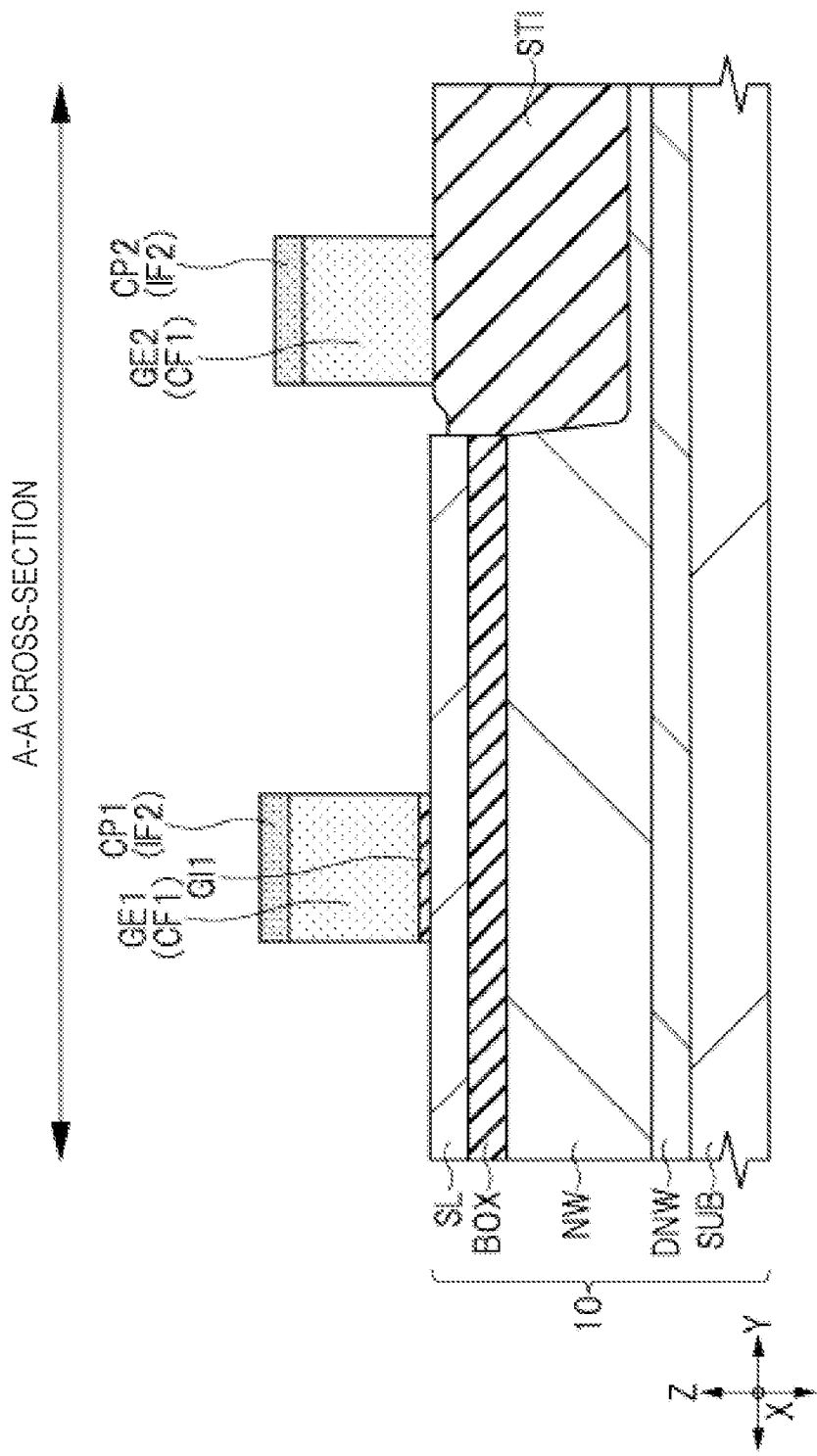
FIG. 7 is a cross-sectional view showing the manufacturing process of the semiconductor device following to FIG. 6.

As shown in FIG. 7, the insulating film IF2 and the conductive film CF1 are patterned. As a result, the gate electrode GE1 and the capping film CP1 located on the gate electrode GE1 are formed on the gate insulating film GI1 and the element isolation portion STI. Through the same manufacturing process, the gate electrode GE2~GE4 and the capping films located on the gate electrode GE2~GE4 are formed.

Figure 8:
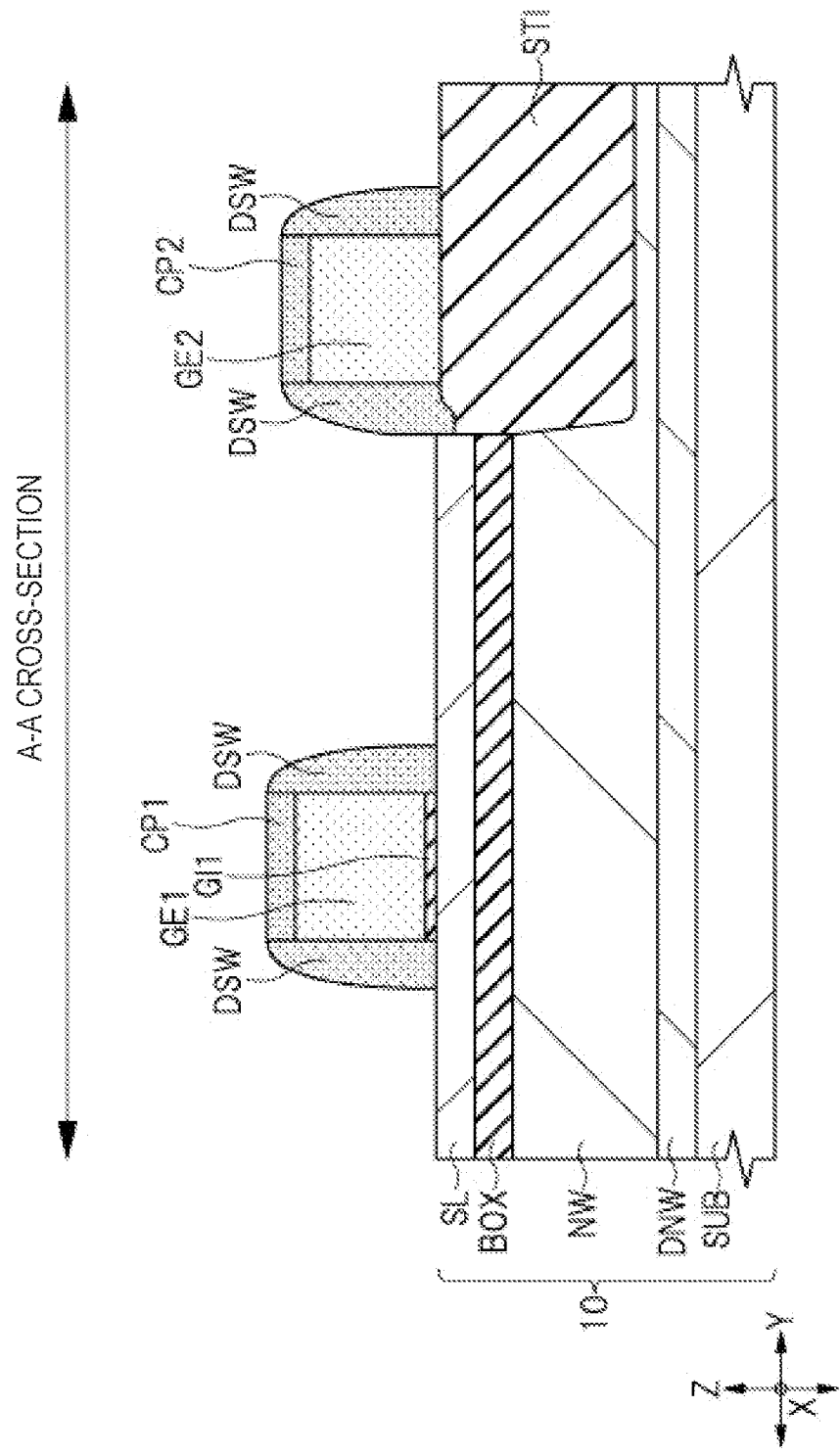
FIG. 8 is a cross-sectional view showing the manufacturing process of the semiconductor device following to FIG. 7.

As shown in FIG. 8, a dummy sidewall spacer DSW is formed on the side surface of the gate electrode GE1. A dummy sidewall spacer DSW is also formed on the side surface of the gate electrode GE2~GE4 by the same manufacturing process. First, a silicon nitride film, for example, is formed by a CVD method so as to cover the gate electrode GE1 and the cap film CP1. Next, an anisotropic etch process is performed on the silicon nitride film to process the silicon nitride film, and a dummy sidewall spacer DSW is formed on the side surface of the gate electrode GE1.

Figure 9:
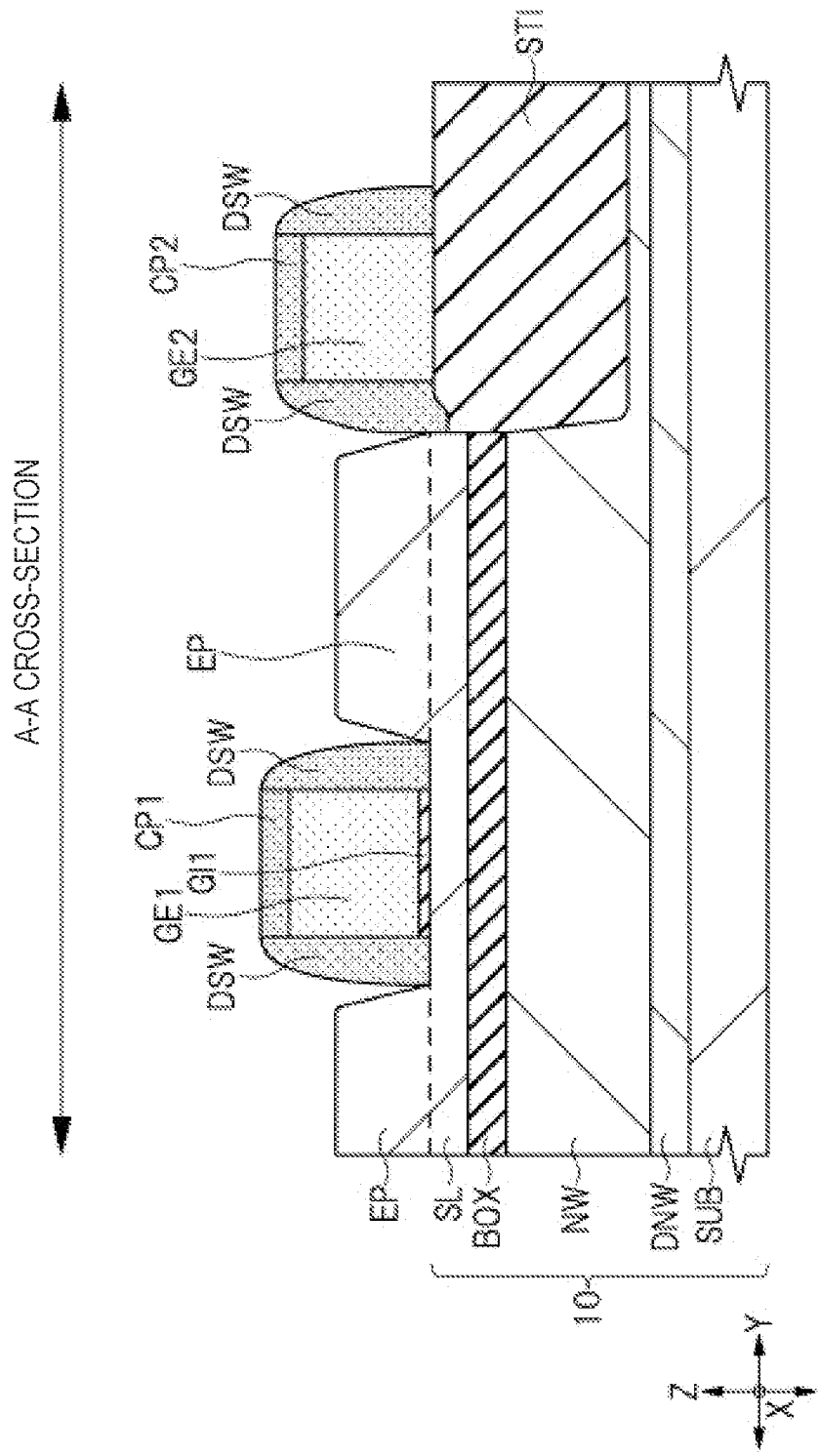
FIG. 9 is a cross-sectional view showing the manufacturing process of the semiconductor device following to FIG. 8.

As shown in FIG. 9, an epitaxial layer EP made of, for example, monocrystalline silicon is formed on the semiconductor layer SL of the active region AcN1 exposed from the dummy sidewall spacer DSW by an epitaxial growth method. The epitaxial layer EP is also formed on the semiconductor layer SL of the active region AcP1, AcP2, AcN2 by the same manufacturing process.

Figure 10:
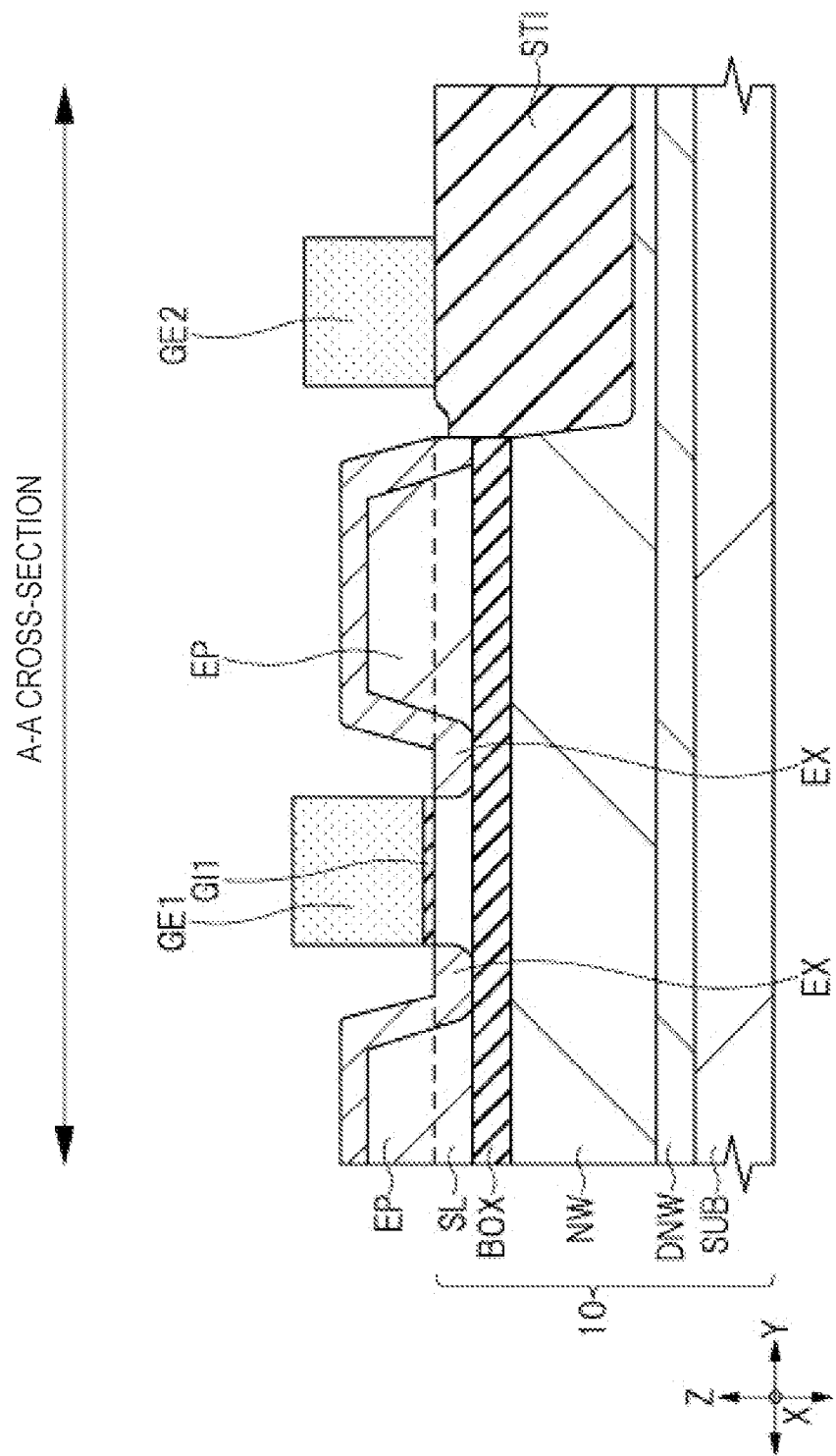
FIG. 10 is a cross-sectional view showing the manufacturing process of the semiconductor device following to FIG. 9.

As shown in FIG. 10, first, the capping film CP1 and the dummy sidewall spacer DSW are removed by an anisotropic etch process. Next, an extension region EX of p-type is formed in the semiconductor layer SL and the epitaxial layer EP in the active region AcN1 by photolithography and ion implantation. An extension region of p-type is formed in the semiconductor layer SL and the epitaxial layer EP in the active region AcN2 by the same manufacturing process. In addition, an extension region of n-type is formed in the semiconductor layer SL and the epitaxial layer EP of the active region AcP1, AcP2.

Figure 11:
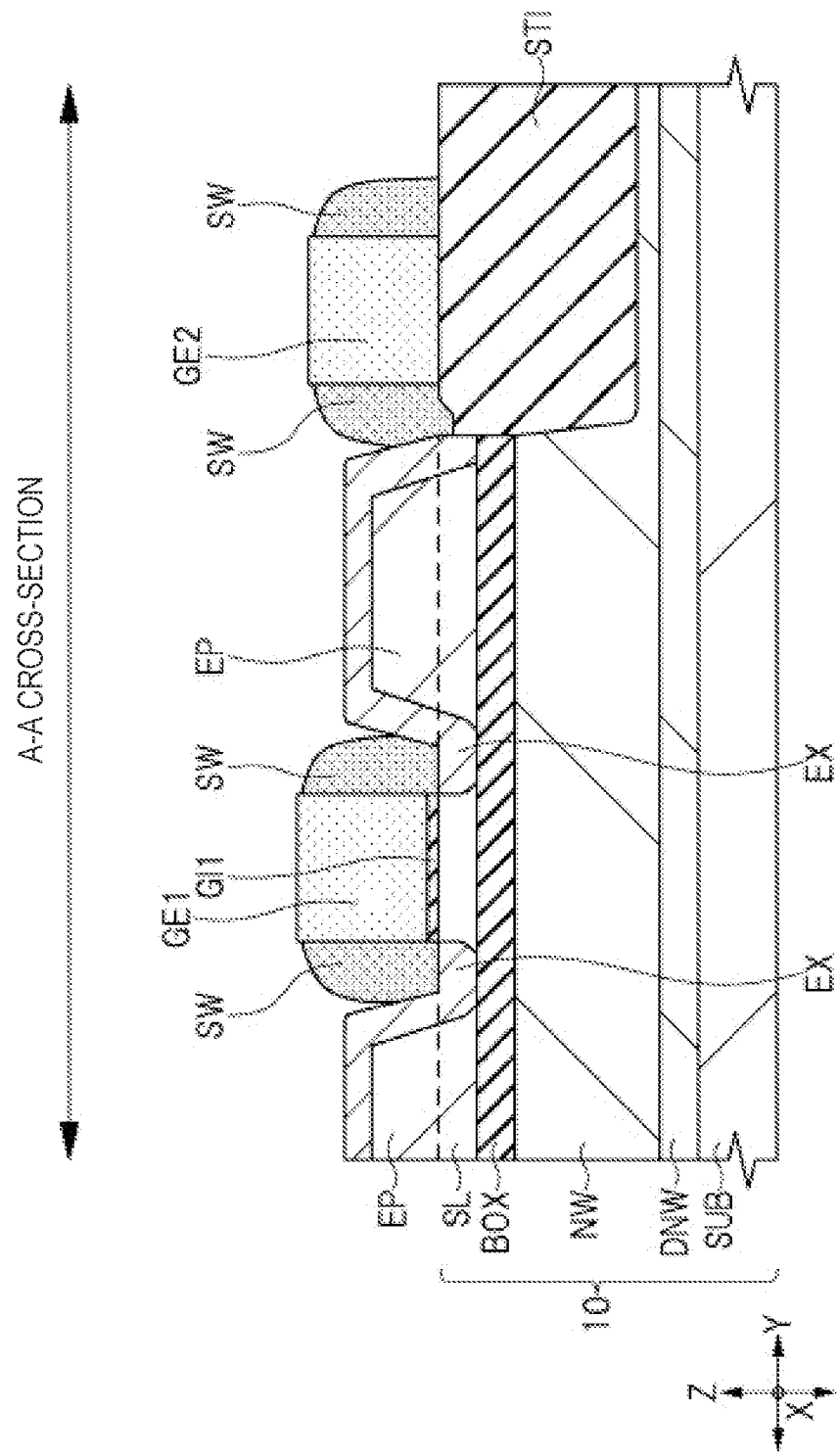
FIG. 11 is a cross-sectional view showing the manufacturing process of the semiconductor device following to FIG. 10.

As shown in FIG. 11, a sidewall spacer SW is formed on a side surface of the gate electrode GE1. The sidewall spacers SW are also formed on the side surfaces of the gate electrode GE2~GE4 by the same manufacturing process. First, for example, a silicon nitride film is formed by, for example, a CVD method so as to cover the gate electrode GE1. Next, an anisotropic etch process is performed on the silicon nitride film to process the silicon nitride film, and a sidewall spacer SW is formed on the side surface of the gate electrode GE1.

Here, the sidewall spacer SW is formed so as to ride on the epitaxial layers EP. Therefore, the sidewall spacer SW covers the border between the semiconductor layer SL and the element isolation portion STI. When the thickness of the silicon nitride film to be the sidewall spacer SW is sufficiently increased, the end portion of the sidewall spacer SW is easily positioned on the epitaxial layers EP.

Figure 12:
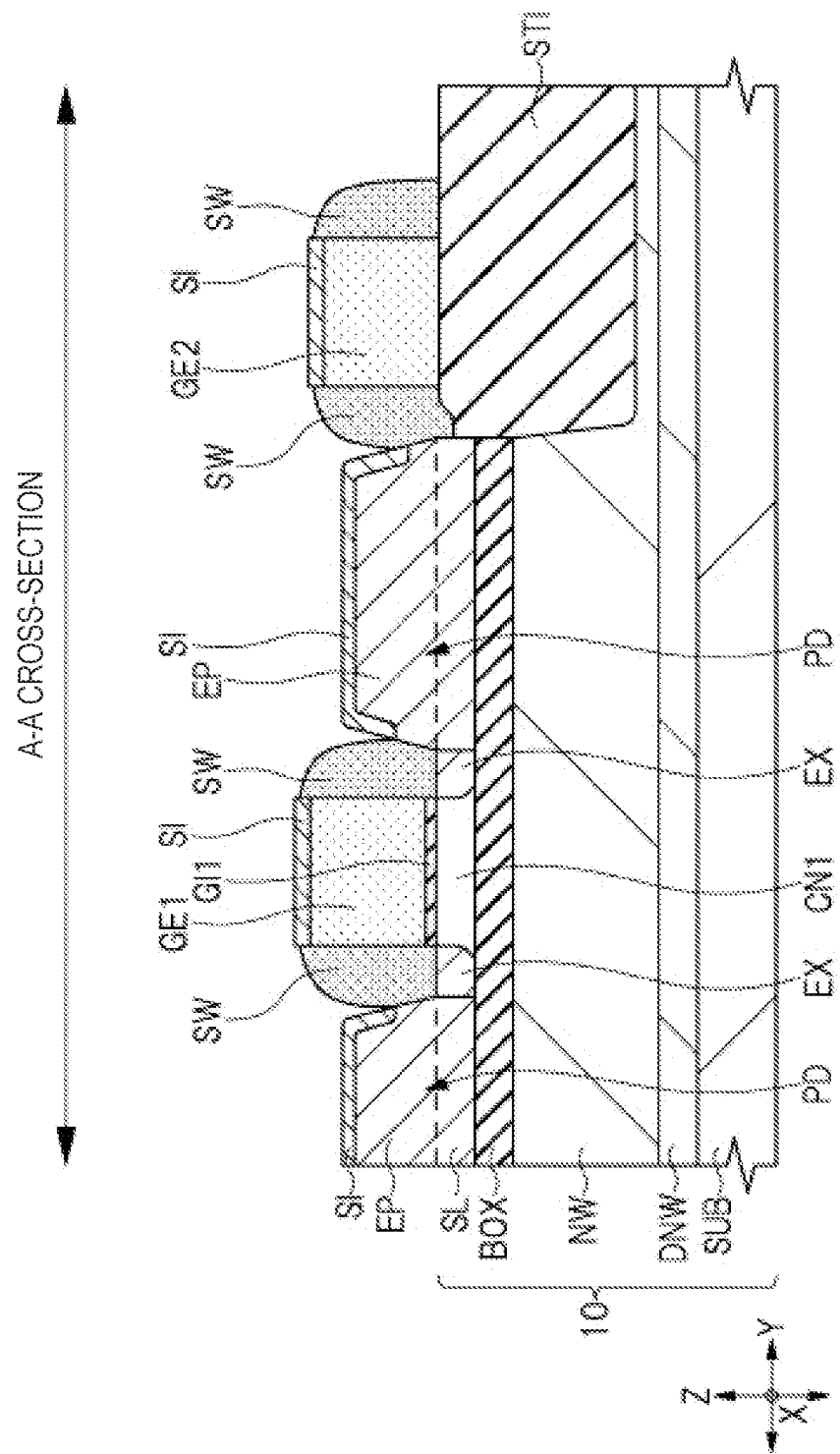
FIG. 12 is a cross-sectional view showing the manufacturing process of the semiconductor device following to FIG. 11.

As shown in FIG. 12, first, a diffusion region PD of p-type is formed in the semiconductor layer SL and the epitaxial layer EP of the active region AcN1 by photolithography and ion-implantation. The diffusion region PD is connected to the extension region EX, and a source region or a drain region of the load transistor Lo1 is formed by the diffusion region PD and the extension region EX. The diffusion region of p-type is formed in the semiconductor layer SL and the epitaxial layer EP of the active region AcN2 by the same manufacturing process. In addition, a diffusion region of n-type is formed in the semiconductor layer SL and the epitaxial layer EP of the active region AcP1, AcP2.

Next, a metallic film is formed so as to cover the gate electrode GE1 and the epitaxial layers EP. The metal film is made of, for example, cobalt, nickel, or a nickel-platinum alloy. Next, semiconductor substrate SUB is subjected to a first heat treatment at about 300° C. to 400° C. and then subjected to a second heat treatment at about 600° C. to 700° C. to react the diffusion region PD and the gate electrode GE1 with the metallic film. As a result, the silicide layers SI are formed on the diffusion regions PD and the gate electrode GE1. Thereafter, the unreacted Above is removed. Through the same manufacturing process, the silicide layers SI are also formed on the gate electrode GE2~GE4 and the diffusion regions of the active regions AcP1, AcP2, AcN2.

Thereafter, the structure shown in FIG. 4 is formed through the following steps. First, an interlayer insulating film IL is formed on the epitaxial layer EP and the element isolation portion STI by, for example, a CVD method so as to cover the gate electrode GE1~GE4 and the sidewall spacer SW.

Next, a shared contact hole SCH1 is formed in the interlayer insulating film IL so as to reach the epitaxial layers EP and the gate electrode GE2 of the active regions AcN1. By the same manufacturing process, the shared contact holes reaching the epitaxial layers EP and the gate electrode GE1 of the active regions AcN2 are formed. Further, other contact hole for filling the plug PGa~PGh, PGw is also formed in the interlayer insulating film IL.

Next, a shared contact plug SPG1 is formed in the shared contact hole SCH1. By the same manufacturing process, a shared contact plug SPG2 is formed in the other shared contact hole, and a plug PGa~PGh, PGw is formed in the other contact hole.

First, a barrier metal film is formed on the interlayer insulating film IL including the contact holes by, for example, a sputtering method or a CVD method. The barrier metal film is, for example, a titanium film or a titanium nitride film, or a laminated film thereof. Next, a tungsten film is formed on the barrier metal film by, for example, a CVD method. Next, the barrier metal film and the tungsten film located outside the contact holes are removed by an anisotropic etch process or a polishing process by a CMP process. The barrier metal film and the tungsten film left in the contact holes serve as a shared contact plug SPG1, SPG2 and a plug PGa~PGh, PGw.

Second Embodiment

Figure 13:
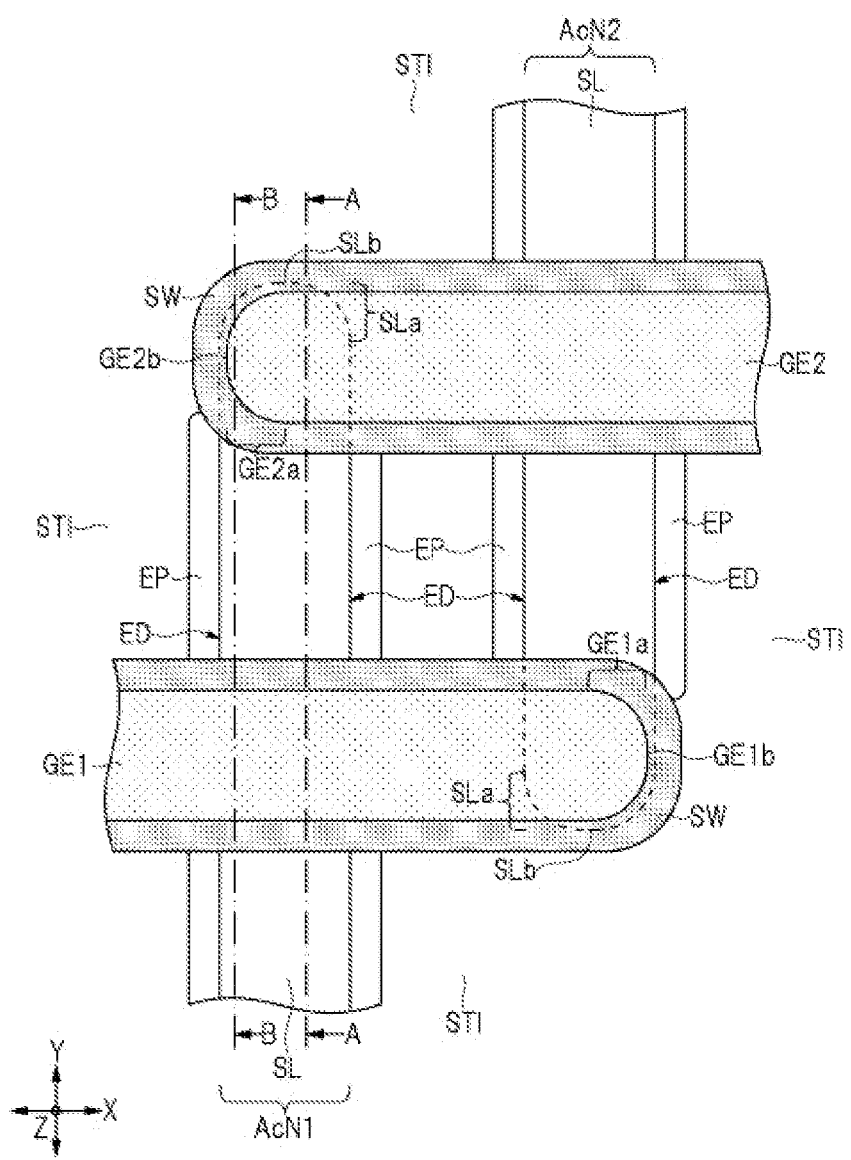
FIG. 13 is a plan view showing a part of a memory cell of a semiconductor device according to a second embodiment.
Figure 14:
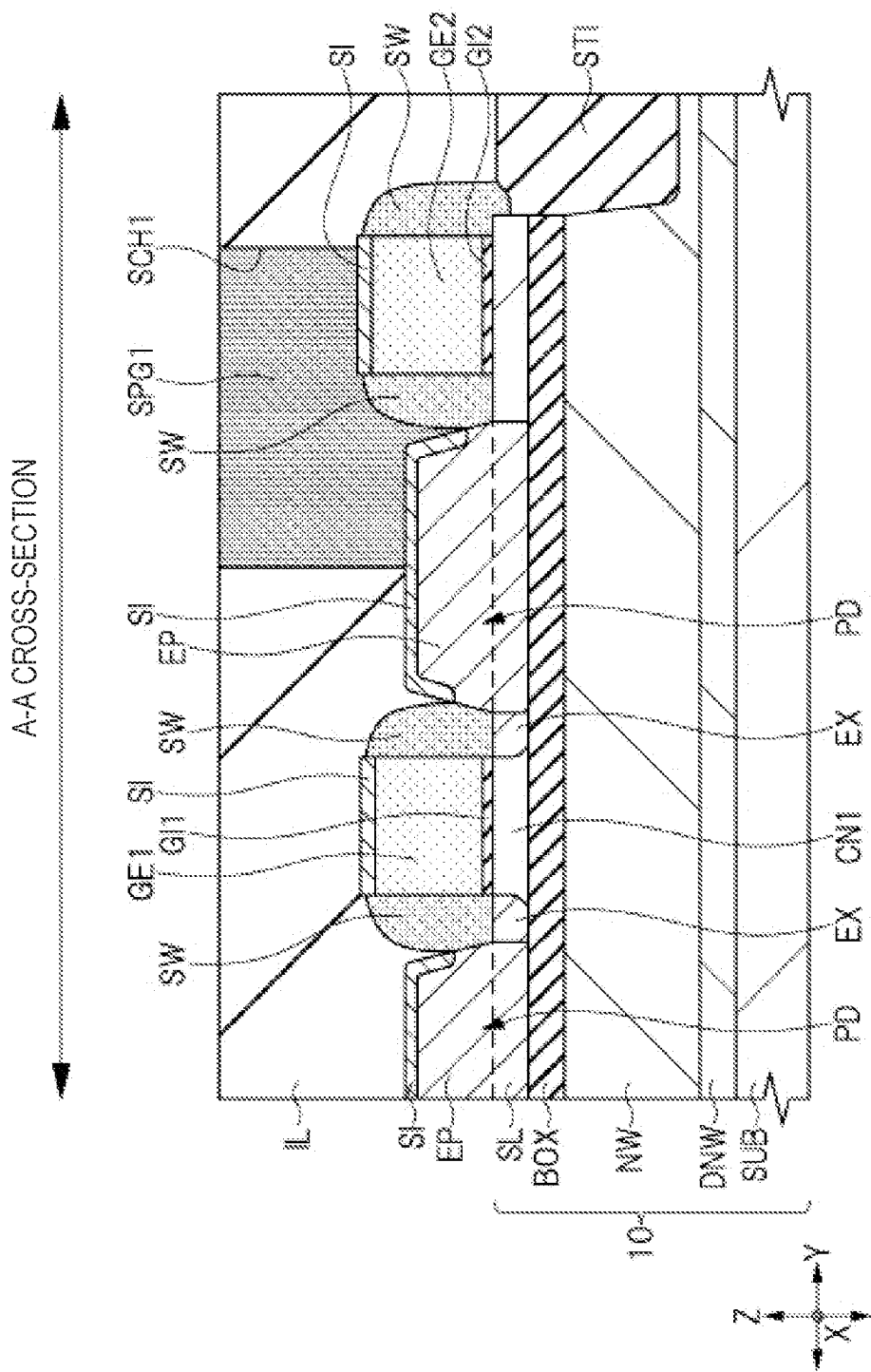
FIG. 14 is a cross-sectional view showing the part of the memory cell of the semiconductor device according to the second embodiment.

A semiconductor device according to a second embodiment will be described below with reference to FIG. 13 and FIG. 14. Note that, in the following description, differences from first embodiment will be mainly described, and the description of overlapping points with first embodiment will be omitted.

In the second embodiment, the end portion GE2a of the gate electrode GE2 does not protrude from the semiconductor layer SL of the active-region AcN1. Instead, as shown in FIGS. 13 and 14, the semiconductor layer SL, the insulating layer BOX, and semiconductor substrate SUB of the active region AcN1 extend in the Y direction rather than in first embodiment, and the gate electrode GE2 and the sidewall spacer SW are also located on the semiconductor layer SL of the active region AcN1. A gate insulating film GI2 of the load transistor Lo2 is formed between the gate electrode GE2 and the semiconductor layer SL of the active region AcN1.

Further, the semiconductor layer SL, the insulating layer BOX, and semiconductor substrate SUB of the active region AcN2 are extended in the Y direction from first embodiment, and the gate electrode GE1 and the sidewall spacer SW are also located on the semiconductor layer SL of the active region AcN2. A gate insulating film GI1 of the load transistor Lo1 is formed between the gate electrode GE1 and the semiconductor layer SL of the active region AcN2.

In the second embodiment, the end portion SLa of the rounded semiconductor layers SL is covered with a gate electrode GE1, GE2 or a sidewall spacer SW. Since a portion where the epitaxial layer EP is very narrow, such as the thin film portion 20, is covered, the shared contact plug SPG1, SPG2 does not touch the semiconductor substrate SUB. Therefore, it is possible to suppress a leakage defect in which the semiconductor layer SL and semiconductor substrate SUB are electrically connected with each other, and thus it is possible to improve the reliability of the semiconductor device.

First Modified Example

A semiconductor device according to a first modified example will be described below with reference to FIG. 15. First modified example applies the techniques described in first embodiment to the techniques described in second embodiment.

Figure 15:
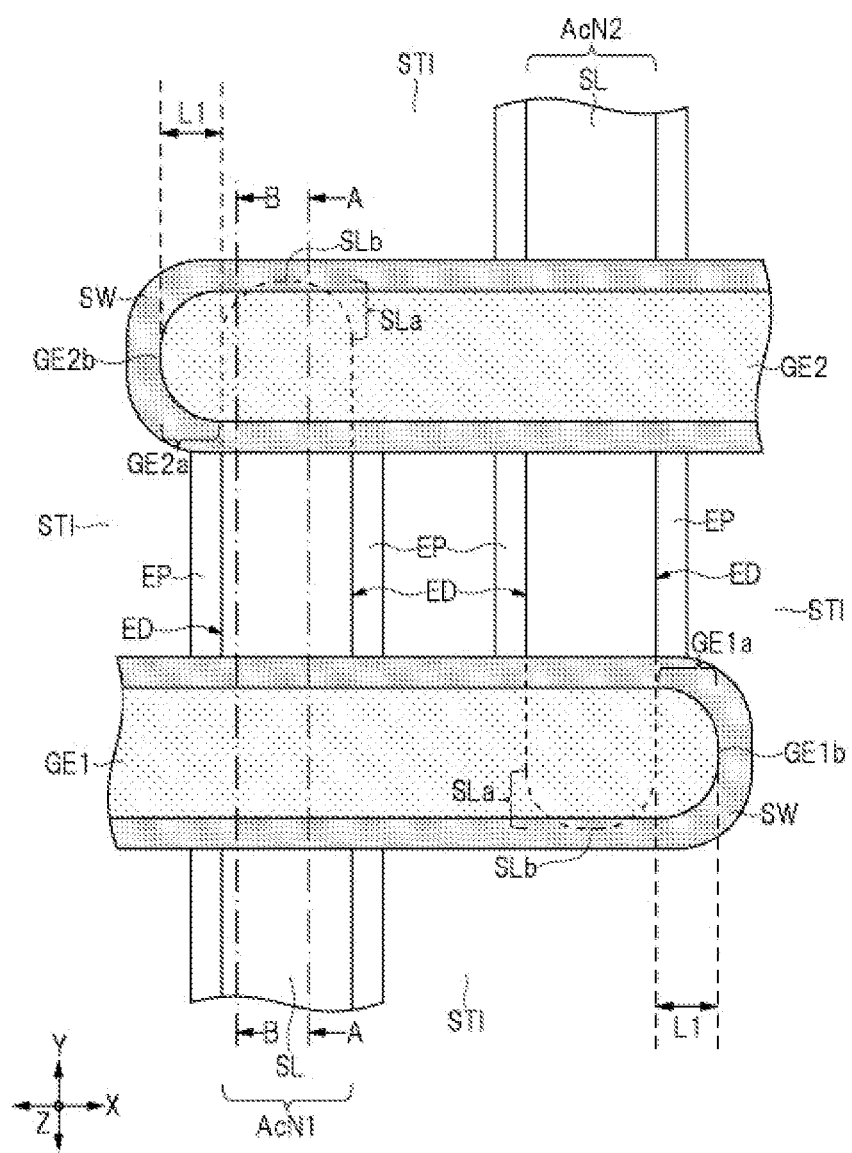
FIG. 15 is a plan view showing a part of a memory cell of a semiconductor device according to a first modified example.

As shown in FIG. 15, even in first modified example, the end portion SLa of the rounded semiconductor layer SL is covered with the gate electrode GE1, GE2 or the sidewall spacer SW.

Further, by causing the gate electrode GE2 to protrude from the active area AcN1 in the semiconductor layer SL ("L1>0"), the end portion GE2a of the rounded gate electrode SL can be spaced away from the end portion SLa of the semiconductor layer GE2. Further, by causing the gate electrode GE1 to protrude from the active area AcN2 in the semiconductor layer SL ("L1>0"), the end portion GE1a of the rounded gate electrode GE1 can be spaced away from the end portion SLa of the semiconductor layer SL.

Therefore, it is possible to further suppress the possibility that each shared contact plug SPG1, SPG2 contacts with the semiconductor substrate SUB.

Second Modified Example

A method of manufacturing a semiconductor device according to a second modified example will be described below with reference to FIG. 16 to FIG. 21. The dummy sidewall spacer DSW is not used in the manufacturing method of the second modified example.

Figure 16:
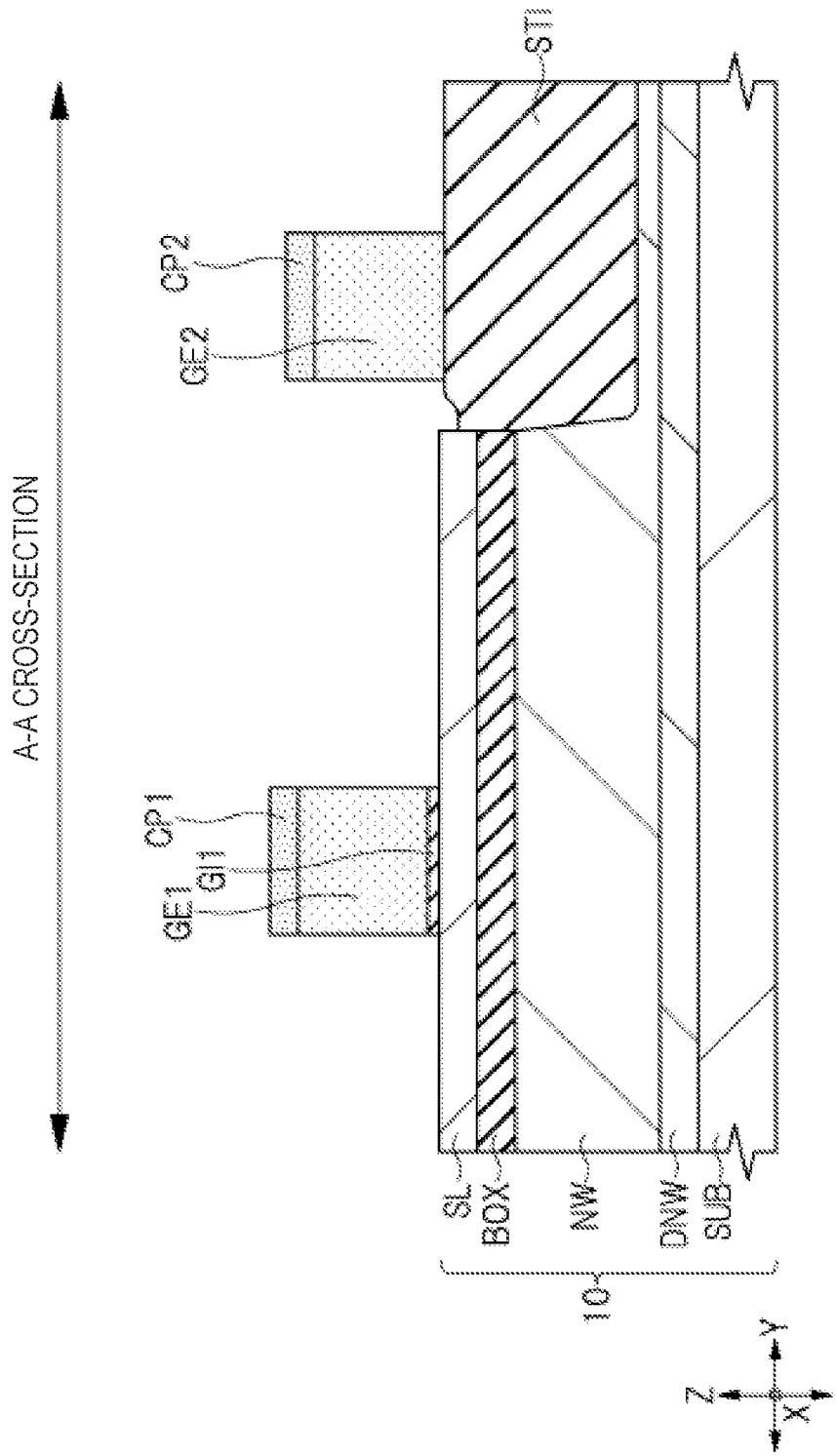
FIG. 16 is a cross-sectional view showing a manufacturing process of a semiconductor device according to a second modified example.

FIG. 16 shows the manufacturing process following to FIG. 6. The insulating film IF2 and the conductive film CF1 are patterned. As a result, the gate electrode GE1 and the capping film CP1 located on the gate electrode GE1 are formed on the gate insulating film GI1 and the element isolation portion STI. Through the same manufacturing process, the gate electrode GE2~GE4 and the capping films located on the gate electrode GE2~GE4 are formed.

Figure 17:
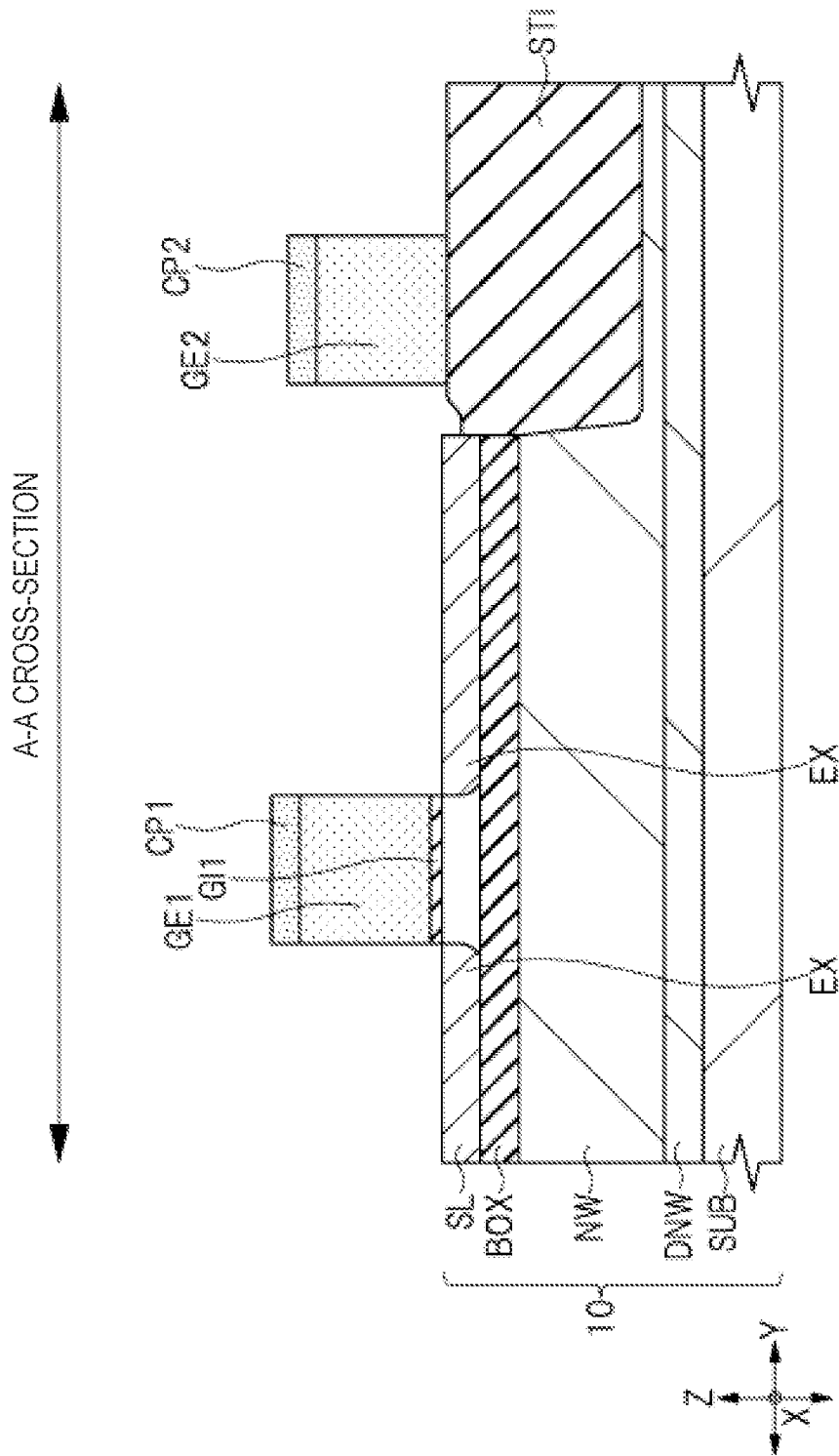
FIG. 17 is a cross-sectional view showing the manufacturing process of the semiconductor device following to FIG. 16.

As shown in FIG. 17, an extension region EX of p-type is formed on SL of the active region AcN1 by photolithography and ion-implantation. An extension region of p-type is formed on SL of the active region AcN2 by the same manufacturing process. In addition, an extension region of n-type is formed on SL of the active region AcP1, AcP2.

Figure 18:
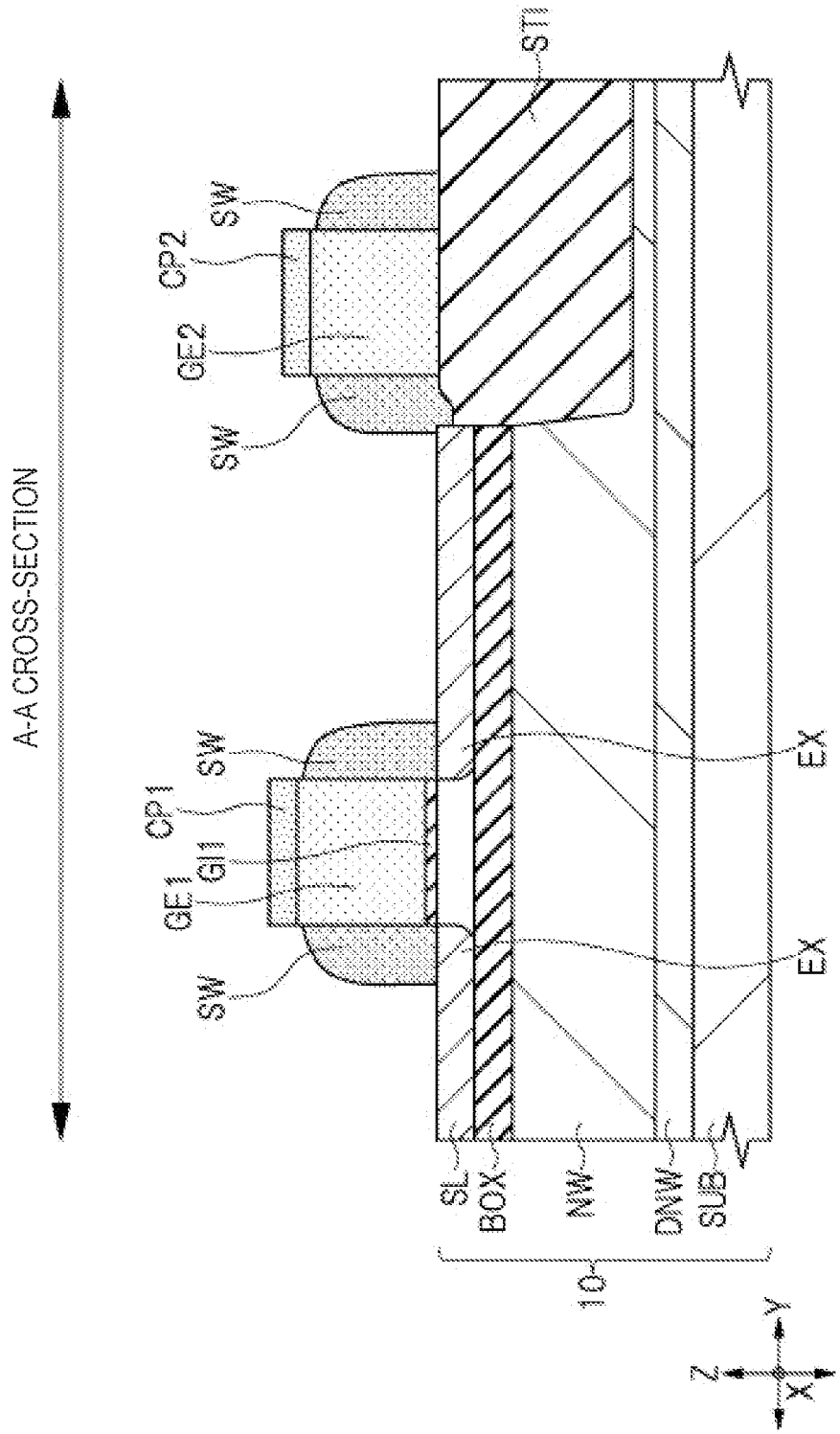
FIG. 18 is a cross-sectional view showing the manufacturing process of the semiconductor device following to FIG. 17.

As shown in FIG. 18, a sidewall spacer SW is formed on a side surface of the gate electrode GE1. The sidewall spacers SW are also formed on the side surfaces of the gate electrode GE2~GE4 by the same manufacturing process. First, for example, a silicon nitride film is formed by, for example, a CVD method so as to cover the gate electrode GE1. Next, an anisotropic etch process is performed on the silicon nitride film to process the silicon nitride film, and a sidewall spacer SW is formed on the side surface of the gate electrode GE1.

Here, the sidewall spacer SW is formed so as to ride on the semiconductor layer SL. Therefore, the tip SLb of the semiconductor layer SL and the end portion SLa around the tip SLb are covered with the sidewall spacer SW. When the thickness of the silicon nitride film to be the sidewall spacer SW is sufficiently increased, it is easy to position the end portion of the sidewall spacer SW on the semiconductor layer SL.

Figure 19:
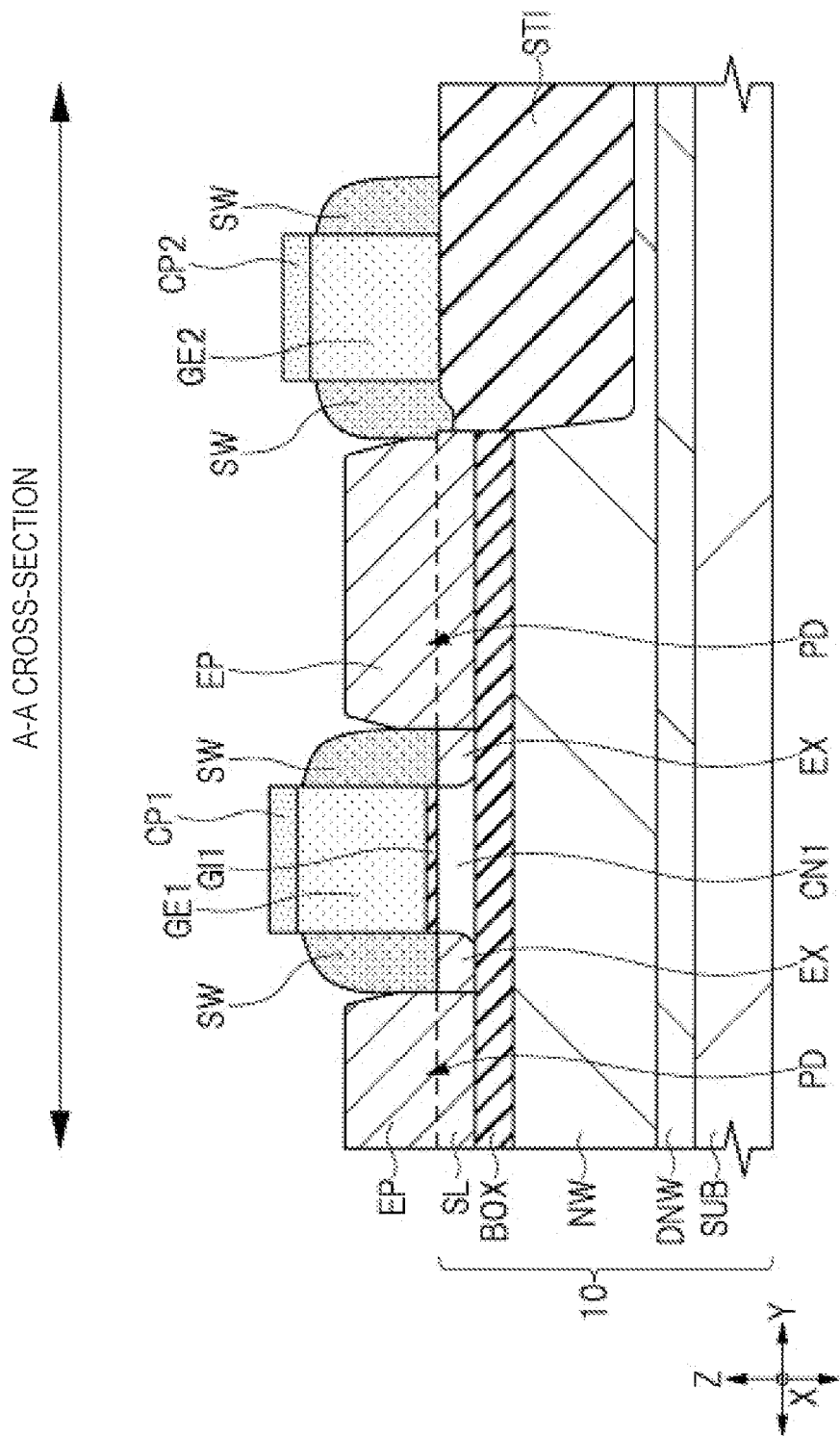
FIG. 19 is a cross-sectional view showing the manufacturing process of the semiconductor device following to FIG. 18.

As shown in FIG. 19, an epitaxial layer EP made of, for example, monocrystalline silicon is formed on the semiconductor layer SL of the active region AcN1 exposed from the sidewall spacer SW by an epitaxial growth method. The epitaxial layer EP is also formed on the semiconductor layer SL of the active region AcP1, AcP2, AcN2 by the same manufacturing process.

Figure 20:
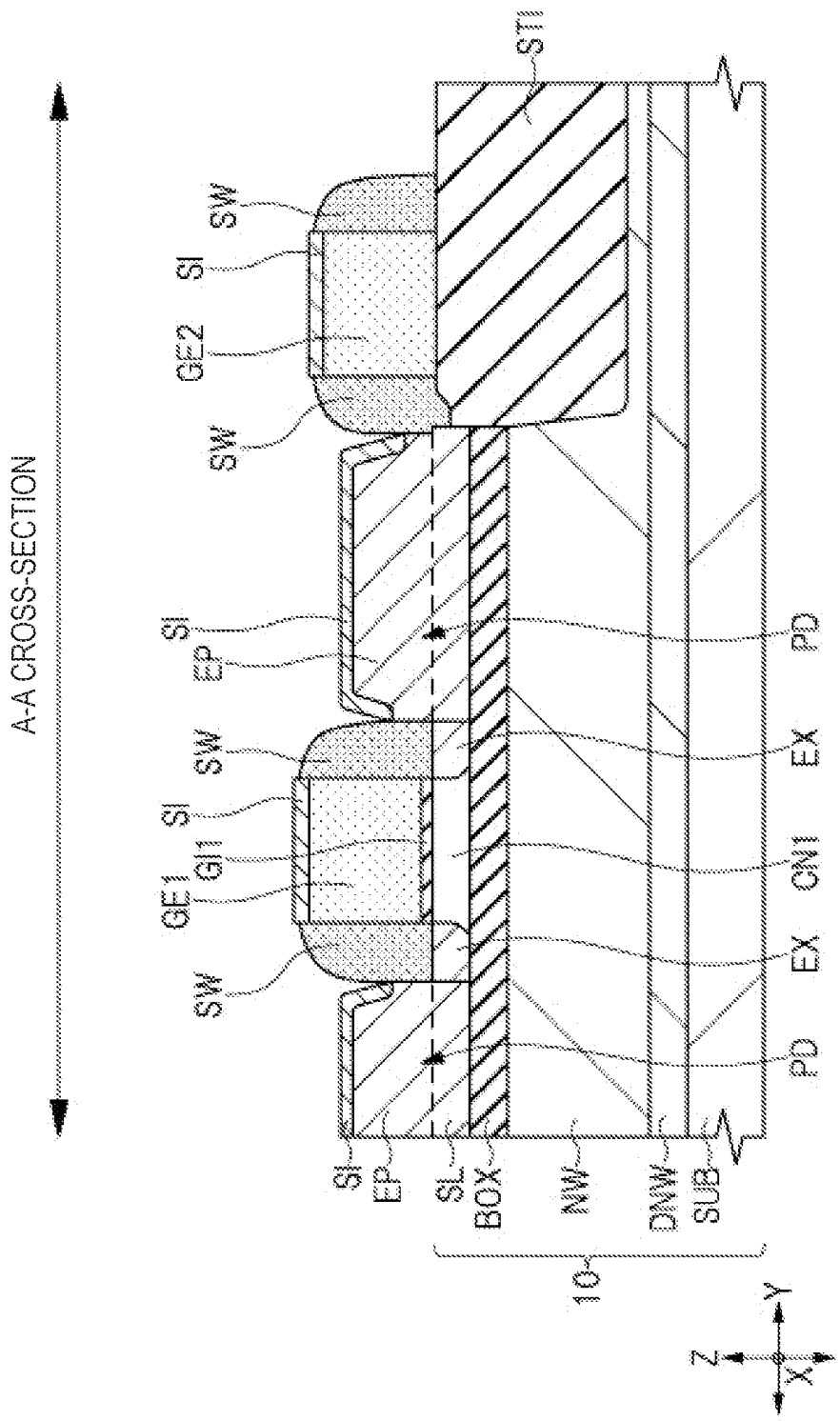
FIG. 20 is a cross-sectional view showing the manufacturing process of the semiconductor device following to FIG. 19.

As shown in FIG. 20, the diffusion region PD of p-type is formed in the semiconductor layer SL and the epitaxial layer EP of the active region AcN1 by photolithography and ion-implantation. The diffusion region of p-type is formed in the semiconductor layer SL and the epitaxial layer EP of the active region AcN2 by the same manufacturing process. In addition, a diffusion region of n-type is formed in the semiconductor layer SL and the epitaxial layer EP of the active region AcP1, AcP2.

Next, a cap film such as a cap film CP1, CP2 formed on the gate electrode GE1~GE4 is removed by an anisotropic etch process. Next, a silicide-layer SI is formed on the gate electrode GE1~GE4, the diffusion region PD, and the other diffusion regions in the same manner as in first embodiment.

Figure 21:
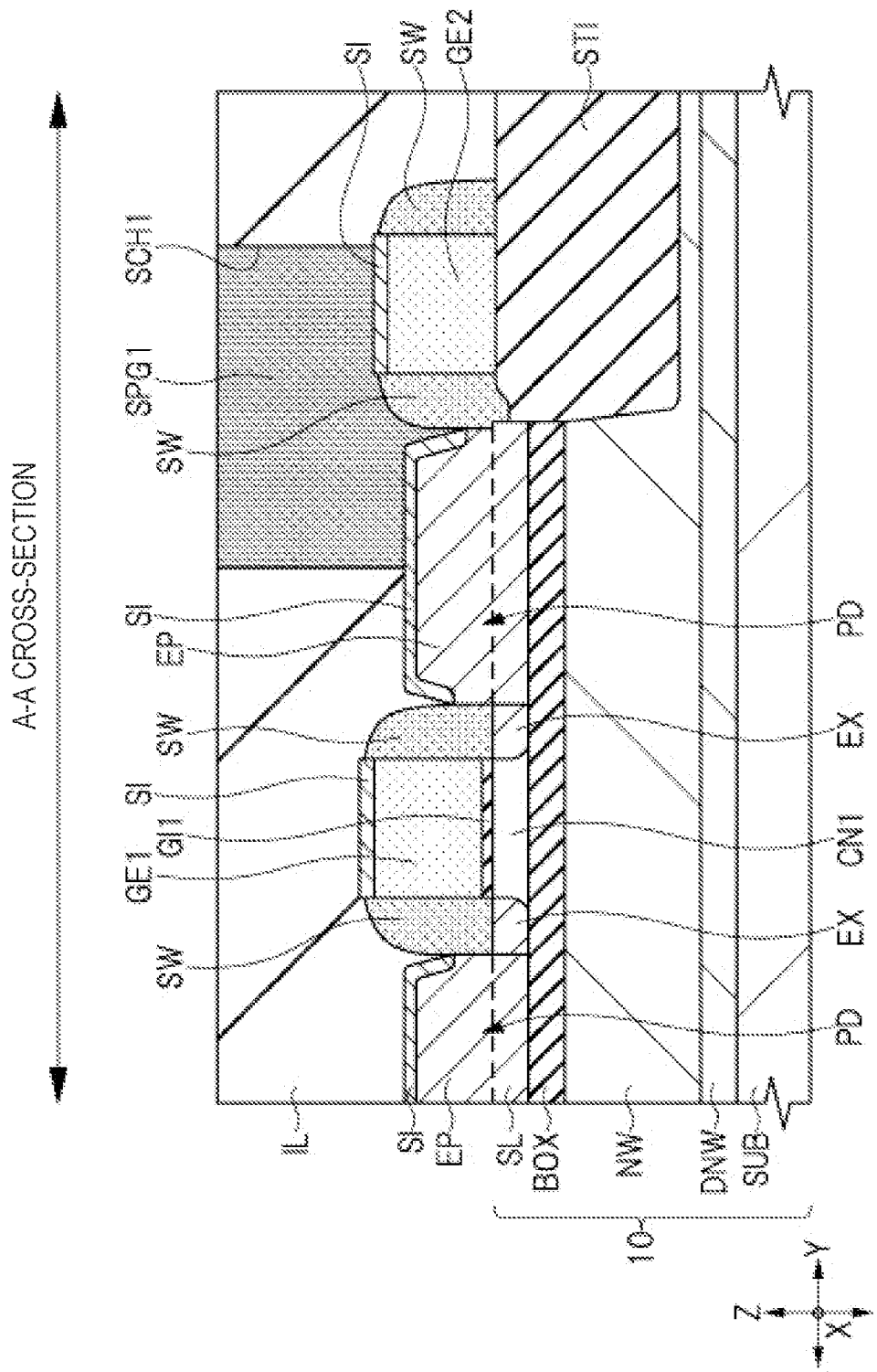
FIG. 21 is a cross-sectional view showing the manufacturing process of the semiconductor device following to FIG. 20.

Next, as shown in FIG. 21, first, an interlayer insulating film IL is formed on the epitaxial layer EP and the element isolation portion STI so as to cover each gate electrode GE1~GE4 and the sidewall spacer SW. Next, a shared contact hole SCH1, SCH2 and other contact holes are formed in the interlayer insulating film IL.

Next, a shared contact plug SPG1 is formed in the shared contact hole SCH1, a shared contact plug SPG2 is formed in the shared contact hole SCH2, and a plug PGa~PGh, PGw is formed in the other contact hole.

Even if the memory cell MC is formed as shown in the second modified example, the position relationship between the tip SLb and the end portion SLa of the semiconductor layer SL and the tip GE1b and the end portion GE1a of the gate electrode GE1 is as described with reference to FIG. 3. The manufacturing method of the second modified example may be applied to the second embodiment and first modified example.

Although the present invention has been described in detail based on the above-described embodiments, the present invention is not limited to the above-described embodiments, and can be variously modified without departing from the gist thereof.

What is claimed is:
1. A semiconductor device comprising:
an SOI substrate including a semiconductor substrate, an insulating layer formed on the semiconductor substrate, and a semiconductor layer formed on the insulating layer;
an element isolation portion penetrating through the semiconductor layer and the insulating layer such that a bottom portion of the element isolation portion reaches an inner portion of the semiconductor substrate;
a first active region partitioned by the element isolation portion and extending in a first direction in plan view, in the SOI substrate;
a second active region partitioned by the element isolation portion, extending in the first direction in plan view, and adjacent to the first active region via the element isolation portion in a second direction intersecting with the first direction in plan view, in the SOI substrate;
a first MISFET formed in the first active region; and
a second MISFET formed in the second active region,
wherein the first MISFET includes:
  a first gate insulating film formed on the semiconductor layer in the first active region;
  a first gate electrode formed on the first gate insulating film and the element isolation portion so as to extend in the second direction;
  a first sidewall spacer formed on a side surface of the first gate electrode;
  a first channel region located beneath the first gate electrode, in the semiconductor layer in the first active region; and
  a first epitaxial layer formed on the semiconductor layer located next to the first channel region,
wherein the second MISFET includes:
  a second gate insulating film formed on the semiconductor layer in the second active region;
  a second gate electrode formed on the second gate insulating film and the element isolation portion so as to extend in the second direction;
  a second sidewall spacer formed on a side surface of the second gate electrode;
  a second channel region located beneath the second gate electrode, in the semiconductor layer in the second active region; and
  a second epitaxial layer formed on the semiconductor layer located next to the second channel region, wherein the semiconductor layer in the first active region has a first end portion having a first distal end farthest from the first gate electrode in a third direction, the third direction being a direction toward the second gate electrode from the first gate electrode in the first direction, wherein the second gate electrode has a second end portion having a second distal end farthest from the second active region in a fourth direction, the fourth direction being a direction toward the first active region from the second active region in the second direction, wherein, in plan view, the second gate electrode is adjacent, in the first direction, to the first distal end of the semiconductor layer in the first active region such that a protruding distance of the second distal end protruded, in the second direction, from the semiconductor layer in the first active region is greater than or equal to 0, wherein the first distal end of the semiconductor layer in the first active region is covered with the second sidewall spacer, and wherein the first epitaxial layer and the second gate electrode are electrically connected to each other via a first shared contact plug formed so as to across the first epitaxial layer, the second sidewall spacer and the second gate electrode.

2. The semiconductor device according to claim 1, wherein a portion of each of the first epitaxial layer and the second epitaxial layer is formed on the element isolation portion.

3. The semiconductor device according to claim 1, wherein a width of the first end portion of the semiconductor layer in the first active region is less than a width of the first channel region, wherein a width of the second end portion of the second gate electrode is less than a width of a portion, which is located on the second channel region, of the second gate electrode, and wherein a boundary between the first end portion and the element isolation portion is covered with one of the first epitaxial layer and the second sidewall spacer.

4. The semiconductor device according to claim 1, wherein the semiconductor layer in the second active region has a third end portion having a third distal end farthest from the second gate electrode in a fifth direction, the fifth direction being a direction toward the first gate electrode from the second gate electrode in the first direction, wherein the first gate electrode has a fourth end portion having a fourth distal end farthest from the first active region in a sixth direction, the sixth direction being a direction toward the second active region from the first active region in the second direction, wherein, in plan view, the first gate electrode is adjacent, in the first direction, to the third distal end of the semiconductor layer in the second active region such that a protruding distance of the fourth distal end protruded, in the second direction, from the semiconductor layer in the second active region is greater than or equal to 0, wherein the third distal end of the semiconductor layer in the second active region is covered with the first sidewall spacer, and wherein the second epitaxial layer and the first gate electrode are electrically connected to each other via a second shared contact plug formed so as to across the second epitaxial layer, the first sidewall spacer and the first gate electrode.

5. The semiconductor device according to claim 4, wherein each of the first MISFET and the second MISFET composes a part of a SRAM circuit.

6. The semiconductor device according to claim 4, wherein, in plan view, the first gate electrode is adjacent, in the first direction, to the third distal end of the semiconductor layer in the second active region such that the protruding distance of the fourth distal end protruded, in the second direction, from the semiconductor layer in the second active region is greater than 0, and wherein, in plan view, the second gate electrode is adjacent, in the first direction, to the first distal end of the semiconductor layer in the first active region such that the protruding distance of the second distal end protruded, in the second direction, from the semiconductor layer in the first active region is greater than 0.

7. A semiconductor device comprising:

an SOI substrate including a semiconductor substrate, an insulating layer formed on the semiconductor substrate, and a semiconductor layer formed on the insulating layer;

an element isolation portion penetrating through the semiconductor layer and the insulating layer such that a bottom portion of the element isolation portion reaches an inner portion of the semiconductor substrate;

a first active region partitioned by the element isolation portion and extending in a first direction in plan view, in the SOI substrate;

a second active region partitioned by the element isolation portion, extending in the first direction in plan view, and adjacent to the first active region via the element isolation portion in a second direction intersecting with the first direction in plan view, in the SOI substrate;

a first MISFET formed in the first active region; and a second MISFET formed in the second active region, wherein the first MISFET includes:

a first gate insulating film formed on the semiconductor layer in the first active region;

a first gate electrode formed on the first gate insulating film and the element isolation portion so as to extend in the second direction;

a first sidewall spacer formed on a side surface of the first gate electrode;

a first channel region located beneath the first gate electrode, in the semiconductor layer in the first active region; and a first epitaxial layer formed on the semiconductor layer located next to the first channel region, wherein the second MISFET includes:

a second gate insulating film formed on the semiconductor layer in the second active region;

a second gate electrode formed on the second gate insulating film and the element isolation portion so as to extend in the second direction;

a second sidewall spacer formed on a side surface of the second gate electrode;

a second channel region located beneath the second gate electrode, in the semiconductor layer in the second active region; and a second epitaxial layer formed on the semiconductor layer located next to the second channel region, wherein the second gate electrode and the second sidewall spacer are located on the semiconductor layer in the first active region, and wherein the first epitaxial layer and the second gate electrode are electrically connected to each other via a first shared contact plug formed so as to across the first epitaxial layer, the second sidewall spacer and the second gate electrode.

8. The semiconductor device according to claim 7, wherein a portion of each of the first epitaxial layer and the second epitaxial layer is formed on the element isolation portion.

9. The semiconductor device according to claim 7, wherein the semiconductor layer in the first active region has a first end portion having a first distal end, wherein a width of the first end portion of the semiconductor layer in the first active region is less than a width of the first channel region, wherein the second gate electrode has a second end portion having a second distal end, wherein a width of the second end portion of the second gate electrode is less than a width of a portion, which is located on the second channel region, of the second gate electrode, and wherein the first end portion is covered with one of the second gate electrode and the second sidewall spacer.

10. The semiconductor device according to claim 9, wherein, in plan view, the second distal end is protruded from the semiconductor layer in the first active region in a direction toward the first active region from the second active region.

11. The semiconductor device according to claim 7, wherein the first gate electrode and the first sidewall spacer are located on the semiconductor layer in the second active region, and wherein the second epitaxial layer and the first gate electrode are electrically connected to each other via a second shared contact plug formed so as to across the second epitaxial layer, the first sidewall spacer and the first gate electrode.

12. The semiconductor device according to claim 11, wherein each of the first MISFET and the second MISFET composes a part of a SRAM circuit.

* * * * *